(12) United States Patent
Kawai et al.

(10) Patent No.: US 12,308,821 B2
(45) Date of Patent: May 20, 2025

(54) RESONATOR AND RESONANCE DEVICE

(71) Applicant: Murata Manufacturing Co., Ltd., Nagaokakyo (JP)

(72) Inventors: Ryota Kawai, Nagaokakyo (JP); Masakazu Fukumitsu, Nagaokakyo (JP); Yoshiyuki Higuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 258 days.

(21) Appl. No.: 18/315,665

(22) Filed: May 11, 2023

(65) Prior Publication Data

US 2023/0283257 A1      Sep. 7, 2023

Related U.S. Application Data

(63) Continuation of application No. PCT/JP2021/027560, filed on Jul. 26, 2021.

(30) Foreign Application Priority Data

Dec. 17, 2020    (JP) ................ 2020-209364

(51) Int. Cl.
     *H03H 9/05*       (2006.01)
     *H03H 9/10*       (2006.01)
     *H03H 9/24*       (2006.01)

(52) U.S. Cl.
     CPC ........ *H03H 9/0595* (2013.01); *H03H 9/1057* (2013.01); *H03H 9/2489* (2013.01)

(58) Field of Classification Search
None
See application file for complete search history.

(56) References Cited

U.S. PATENT DOCUMENTS 8,347,719 B2 *    1/2013    Ichikawa ............ H03H 9/1035
                                                        29/25.35
11,824,517 B2 *   11/2023   Kaajakari ............ H03H 9/2489
(Continued)

FOREIGN PATENT DOCUMENTS

WO      2016174789 A1    11/2016
WO      2016175218 A1    11/2016
(Continued)

OTHER PUBLICATIONS

International Search Report in PCT/JP2021/027560, mailed Oct. 5, 2021, 3 pages.

*Primary Examiner* — Bernard Rojas
(74) *Attorney, Agent, or Firm* — ArentFox Schiff LLP

(57) ABSTRACT

A resonator is provided that includes a vibrating portion including three or more vibrating arms with at least two vibrating arms that bend out of plane with different phases and a base. The resonator also includes a frame that holds the vibrating portion; and a support arm having one end connected to the frame and the other end connected to a rear end portion of the base. The other end of the support arm is connected to a position in a range from −0.1 WB to 0.1 WB, with respect to a base width WB of the base, relative to a position, on the rear end portion of the base where a center line passes in a plan view. A support arm length of the support arm is 0.2 or more times and 0.4 or less times a vibrating arm length of the vibrating arms.

20 Claims, 14 Drawing Sheets

(56) References Cited

U.S. PATENT DOCUMENTS

| | | | |
|---|---|---|---|
| 2009/0174286 A1* | 7/2009 | Yoshimatsu | H03H 9/0595 |
| | | | 310/321 |
| 2009/0178260 A1* | 7/2009 | Yamazaki | H03H 3/04 |
| | | | 29/25.35 |
| 2010/0156246 A1* | 6/2010 | Iwai | H03H 9/0595 |
| | | | 310/370 |
| 2018/0034441 A1 | 2/2018 | Hirota et al. | |
| 2018/0048286 A1 | 2/2018 | Goto et al. | |
| 2021/0006230 A1 | 1/2021 | Kawai et al. | |
| 2021/0167754 A1 | 6/2021 | Inoue et al. | |
| 2021/0184651 A1 | 6/2021 | Kawai et al. | |

FOREIGN PATENT DOCUMENTS

| | | |
|---|---|---|
| WO | 2019207829 A1 | 10/2019 |
| WO | 2020049789 A1 | 3/2020 |
| WO | 2020067484 A1 | 4/2020 |

\* cited by examiner

RESONATOR AND RESONANCE DEVICE

CROSS REFERENCE TO RELATED APPLICATIONS

This application is a continuation of PCT Application No. PCT/JP2021/027560, filed Jul. 26, 2021, which claims priority to Japanese Patent Application No. 2020-209364, filed Dec. 17, 2020, the entire contents of each of which are hereby incorporated by reference in their entirety.

TECHNICAL FIELD

The present invention relates to a resonator and a resonance device in which a plurality of vibrating arms vibrate in an out-of-plane bending vibration mode.

BACKGROUND

Conventionally, a resonance device with use of micro electro mechanical systems (MEMS) technology has been used as a timing device, for instance. In one implementation, this resonance device is mounted on a printed circuit board integrated in electronic equipment such as smartphone. The resonance device includes a lower-side substrate, an upper-side substrate to form a cavity between the upper-side substrate and the lower-side substrate, and a resonator placed in the cavity between the lower-side substrate and the upper-side substrate.

A resonator whose resonant frequency is changed by overexcitation of vibrating arms resulting in collision of regulation films at extremities of the vibrating arms with an upper-side board or a lower-side board in a frequency regulation step for fine regulation of the resonant frequency of the resonator is disclosed in International Publication No. 2016/175218 (hereinafter "Patent Document 1"), for instance.

Meanwhile, in recent years, improvement in drive level dependency (DLD) (which will be referred to as "DLD" hereinbelow), represented by a changing rate in the resonant frequency with respect to drive level, has been demanded for resonators.

A structure for the improvement in DLD, however, may decrease a regulation rate for the resonant frequency in the frequency regulation step. However, it is possible that such a resonator may cause decrease in manufacturing efficiency because it takes much time to manufacture the resonator.

SUMMARY OF THE INVENTION

Accordingly, it is an object of the present invention to provide a resonator and a resonance device by which DLD can be improved and by which decrease in the regulation rate for the resonant frequency can be inhibited.

In an exemplary aspect, a resonator is provided that includes a vibrating portion, a holding portion (e.g., a frame), and a support arm. The vibrating portion includes a plurality of vibrating arms numbering in three or more, each having a fixed end, and including at least two vibrating arms that bend out of plane with different phases; and a base having one end to which the fixed end of each of the plurality of vibrating arms is connected and the other end opposed to the one end. The holding portion holds the vibrating portion. The support arm has one end connected to the holding portion and the other end connected to the other end of the base portion. The other end of the support arm is connected to a position in a range from −0.1 WB to 0.1 WB relative to a position, as a reference, on the other end of the base portion where a center line of the vibrating portion in a longitudinal direction thereof passes in a plan view, with respect to a base width WB that is a length of the base in a direction orthogonal to the center line. A length of the support arm in a direction parallel to the longitudinal direction of the vibrating portion is 0.2 or more times and 0.4 or less times a length of the vibrating arms in the longitudinal direction.

Moreover, in an exemplary aspect, a resonance device is provided that includes the resonator described above.

According to the exemplary aspects of the present invention, DLD is improved and the decrease in the regulation rate for the resonant frequency can be inhibited.

DETAILED DESCRIPTION OF EMBODIMENTS

Figure 1:
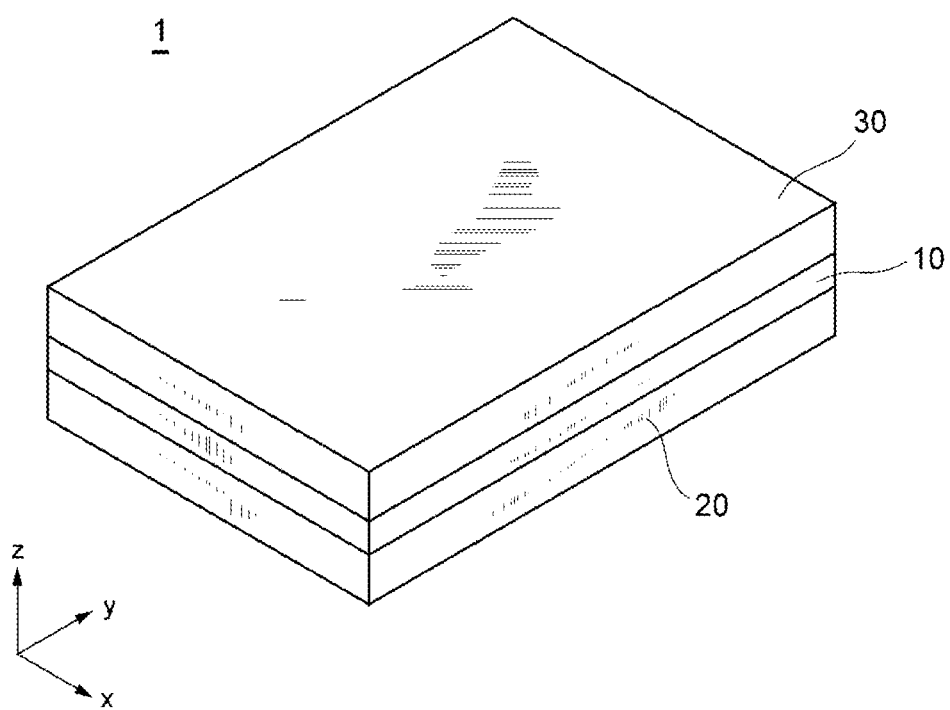
FIG. 1 is a perspective view generally illustrating an exterior of a resonance device in one exemplary embodiment.

Hereinbelow, exemplary embodiments of the present invention will be described. In a following description of the drawings, the same or similar components will be represented with use of the same or similar reference characters.

In general, it is noted that the drawings are exemplary, sizes or shapes of portions are schematic, and technical scope of the present invention should not be understood with limitation to the embodiments.

Figure 2:
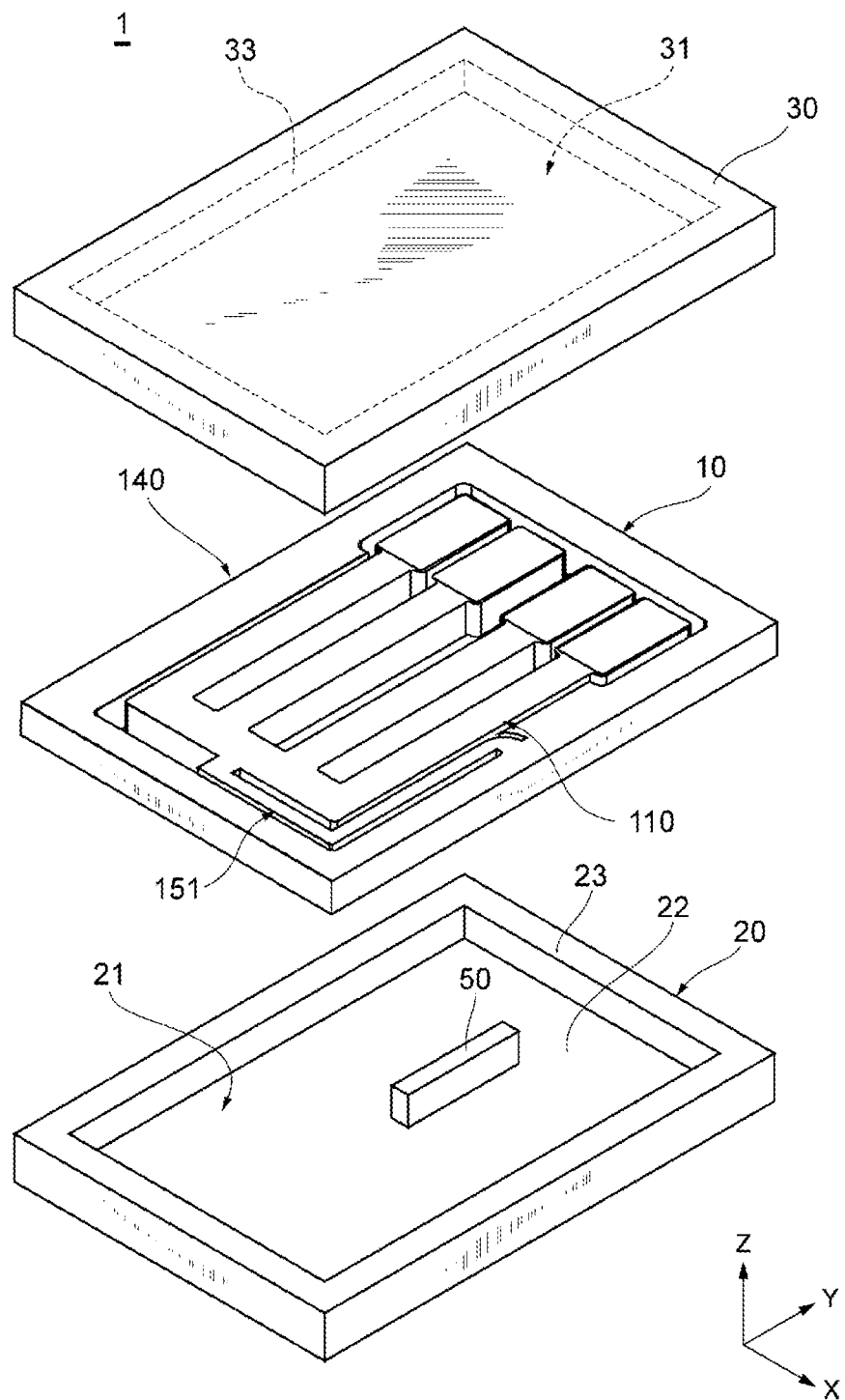
FIG. 2 is an exploded perspective view generally illustrating a structure of the resonance device illustrated in FIG. 1.

Initially, a general configuration of a resonance device according to one exemplary embodiment will be described with reference to FIGS. 1 and 2. FIG. 1 is a perspective view generally illustrating an exterior of a resonance device 1 in the one embodiment. FIG. 2 is an exploded perspective view generally illustrating a structure of the resonance device 1 illustrated in FIG. 1.

As shown, the resonance device 1 includes a lower lid 20, a resonator 10, and an upper lid 30. That is, the resonance device 1 is configured by the lower lid 20, the resonator 10, and the upper lid 30 that are stacked in this order. The lower lid 20 and the upper lid 30 are placed so as to face each other with the resonator 10 interposed therebetween. Incidentally, the lower lid 20 and the upper lid 30 correspond to an example of "lid body" of the present disclosure.

Hereinbelow, configurations of the resonance device 1 will be described. Incidentally, the description below will be given with reference to a side of the resonance device 1 provided with the upper lid 30 as upper (or front) side and reference to a side of the resonance device 1 provided with the lower lid 20 as lower (or back) side.

In an exemplary aspect, the resonator 10 is a MEMS vibrator produced with use of MEMS technology. The resonator 10, the lower lid 20, and the upper lid 30 are jointed (e.g., coupled) so that the resonator 10 is sealed and so that a vibration space for the resonator 10 is formed. Further, the resonator 10, the lower lid 20, and the upper lid 30 are each formed with use of a silicon (Si) substrate (which will be referred to as "Si substrate" below) and the Si substrates are jointed to one another. Incidentally, the resonator 10, the lower lid 20, and the upper lid 30 may be each formed with use of a silicon on insulator (SOI) substrate in which silicon layers and silicon oxide film are stacked.

As further shown, the lower lid 20 includes a bottom plate 22 provided along XY plane and shaped like a rectangular flat plate and side walls 23 extending in Z axis direction, that is, a stacking direction for the lower lid 20 and the resonator 10 from a peripheral portion of the bottom plate 22. A recessed portion 21 defined by a front surface of the bottom plate 22 and inside surfaces of the side walls 23 is formed or otherwise disposed on a face of the lower lid 20 that faces the resonator 10. The recessed portion 21 forms at least a portion of the vibration space for the resonator 10. Incidentally, the lower lid 20 may lack the recessed portion 21 and may have a configuration like a flat plate. Further, a getter layer may be formed on a face of the recessed portion 21 of the lower lid 20 on a side of the resonator 10 according to an exemplary aspect.

Further, the lower lid 20 includes a protruding portion 50 formed on the front surface of the bottom plate 22. A detailed configuration of the protruding portion 50 will be described later.

The upper lid 30 includes a bottom plate 32 provided along XY plane and shaped like a rectangular flat plate and side walls 33 extending in Z axis direction from a peripheral portion of the bottom plate 22. A recessed portion 31 defined by a front surface of the bottom plate 32 and inside surfaces of the side walls 33 is formed on a face of the upper lid 30 that faces the resonator 10. The recessed portion 31 forms at least a portion of the vibration space that is a space in which the resonator 10 vibrates. In an exemplary aspect, the upper lid 30 may lack the recessed portion 31 and may have a configuration like a flat plate. Further, a getter layer may be formed on a face of the recessed portion 31 of the upper lid 30 on a side of the resonator 10 according to an exemplary aspect.

By jointing of the upper lid 30, the resonator 10, and the lower lid 20, the vibration space for the resonator 10 is airtightly sealed so that a vacuum state is maintained. This vibration space may be filled with gas such as inert gas, for instance.

Figure 3:
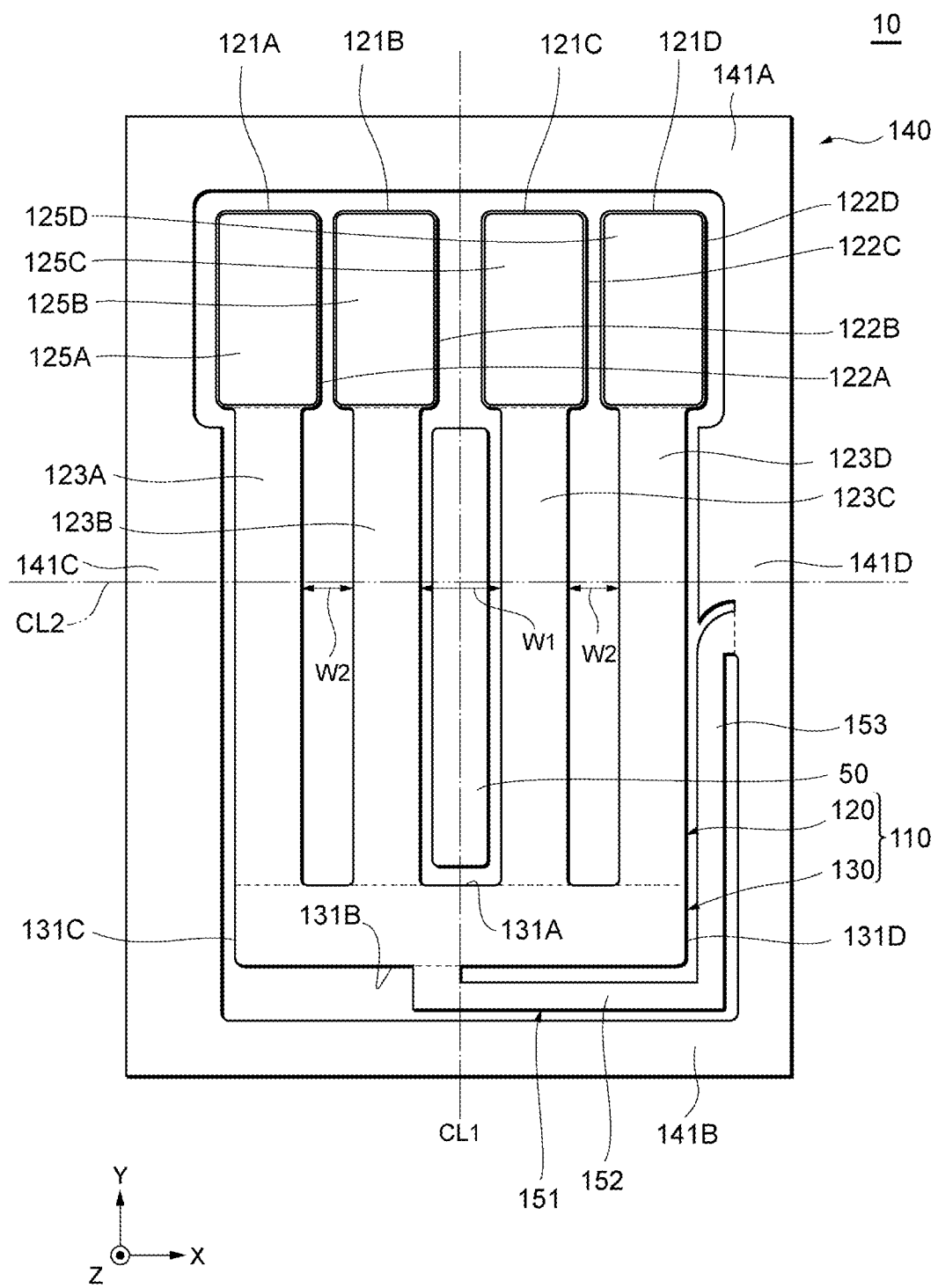
FIG. 3 is a plan view generally illustrating a structure of a resonator illustrated in FIG. 2.

Subsequently, a general configuration of the resonator according to the embodiment will be described with reference to FIG. 3. FIG. 3 is a plan view generally illustrating a structure of the resonator 10 illustrated in FIG. 2.

As illustrated in FIG. 3, the resonator 10 is the MEMS vibrator produced with use of the MEMS technology and vibrates with an out-of-plane bending vibration mode as principal vibration (which may be referred to as "main mode" hereinbelow) in XY plane in an orthogonal coordinate system of FIG. 3.

The resonator 10 includes a vibrating portion 110, a holding portion 140 (also referred to as a "frame"), and a support arm 151.

In the exemplary aspect, the vibrating portion 110 has rectangular contours extending along XY plane in the orthogonal coordinate system of FIG. 3. The vibrating portion 110 is placed in an inner side portion of the holding portion 140 and a space is formed between the vibrating portion 110 and the holding portion 140 with specified intervals. In an example of FIG. 3, the vibrating portion 110 includes an excitation portion 120 made of four vibrating arms 121A to 121D (which may be collectively referred to as "vibrating arms 121" hereinbelow) and a base portion 130 (also referred to as a "base"). Incidentally, the number of the vibrating arms is not limited to four and may be set at any desired number greater than or equal to three in exemplary aspects. In the embodiment, the excitation portion 120 and the base portion 130 are integrally formed.

The plurality of vibrating arms 121A, 121B, 121C, and 121D each extend along Y axis direction and are provided in parallel at specified intervals in X axis direction in order of mention. One end of the vibrating arm 121A is a fixed end connected to a front end portion 131A of the base portion 130 that will be described later and the other end of the vibrating arm 121A is an open end provided far from the front end portion 131A of the base portion 130. The vibrating arm 121A includes a mass addition portion 122A formed on a side of the open end and an arm portion 123A extending from the fixed end and connected to the mass addition portion 122A. Similarly, the vibrating arms 121B, 121C, and 121D respectively include mass addition portions 122B, 122C, and 122D and arm portions 123B, 123C, and 123D. Incidentally, the arm portions 123A to 123D each have a width on the order of 26 μm along X axis direction and a length on the order of 246 μm along Y axis direction, for instance. In an exemplary aspect, the mass addition portions 122A, 122B, 122C, and 122D can be configured as "weights" to support vibration during operation.

In the excitation portion 120 of the embodiment, the two vibrating arms 121A and 121D are placed in outer side portions and the two vibrating arms 121B and 121C are placed in an inner side portion with respect to X axis direction. A width (which will be referred to as "release width" hereinbelow) W1 of a gap formed between the arm portions 123B and 123C of the two vibrating arms 121B and 121C in the inner side portion is set greater than a release width W2 between the arm portions 123A and 123B of the vibrating arms 121A and 121B adjoining in X axis direction and also greater than the release width W2 between the arm portions 123D and 123C of the vibrating arms 121D and 121C adjoining in X axis direction, for instance. The release width W1 is on the order of 40 µm, for instance, and the release width W2 is on the order of 18 µm, for instance. Thus, vibration characteristics and durability of the vibrating portion 110 are improved by setting of the release width W1 greater than the release width W2. Incidentally, in order that the resonance device 1 may be miniaturized, the release width W1 may be set smaller than the release width W2 or the release width W1 and the release width W2 may be set so as to make equal intervals.

The mass addition portions 122A to 122D include mass addition films 125A to 125D on respective front surfaces. Therefore, weights per unit length (which may be simply referred to as "weights" for purposes of this disclosure) of the mass addition portions 122A to 122D are respectively heavier than weights of the arm portions 123A to 123D. Thus, the vibration characteristics can be improved while the vibrating portion 110 is miniaturized. Further, the mass addition films 125A to 125D do not only each have a function of increasing weights of extremity portions of the vibrating arms 121A to 121D but also each have a function, as so-called frequency regulation film, of regulating resonant frequencies of the vibrating arms 121A to 121D with scraping of portions thereof.

In the embodiment, widths of the mass addition portions 122A to 122D along X axis direction are on the order of 49 µm, for instance, and are greater than widths of the arm portions 123A to 123D along X axis direction, respectively. Thus, the weights of the mass addition portions 122A to 122D can be further increased. For miniaturization of the resonator 10, the widths of the mass addition portions 122A to 122D along X axis direction are preferably 1.5 or more times the widths of the arm portions 123A to 123D along X axis direction, respectively. It is sufficient, however, if the weights of the mass addition portions 122A to 122D are respectively heavier than the weights of the arm portions 123A to 123D and the widths of the mass addition portions 122A to 122D along X axis direction are not limited to the example of the embodiment. In another exemplary aspect, the widths of the mass addition portions 122A to 122D along X axis direction may be smaller than or equal to the widths of the arm portions 123A to 123D along X axis direction, respectively.

In a plan view of the resonator 10 from above (which will be simply referred to as "plan view" for purposes of this disclosure), the mass addition portions 122A to 122D each have a curved shape substantially shaped like a rectangle and rounded at four corners, such as so-called R shape. Similarly, the arm portions 123A to 123D are each substantially shaped like a rectangle and have the R shapes in vicinities of the fixed ends connected to the base portion 130 and in vicinities of connection portions connected to the mass addition portions 122A to 122D, respectively. The shapes of the mass addition portions 122A to 122D and the arm portions 123A to 123D, however, are not limited to the example of the embodiment. For instance, the shapes of the mass addition portions 122A to 122D may be substantially like trapezoids or letters L. Further, the shapes of the arm portions 123A to 123D may be substantially like trapezoids. A bottomed groove portion having an opening on either of a front surface side and a back surface side or a hole portion having openings on both of the front surface side and the back surface side may be formed on each of the mass addition portions 122A to 122D and the arm portions 123A to 123D. The groove portion and the hole portion may be separated from side surfaces linking the front surface and the back surface or may have an opening on a side of the side surface.

In the plan view, the base portion 130 includes the front end portion 131A, a rear end portion 131B, a left end portion 131C, and a right end portion 131D. As described above, the fixed ends of the vibrating arms 121A to 121D are connected to the front end portion 131A. The support arm 151 is connected to the rear end portion 131B.

Each of the front end portion 131A, the rear end portion 131B, the left end portion 131C, and the right end portion 131D is a portion of an outer peripheral portion of the base portion 130 (i.e., the base of the vibrating portion). Specifically, the front end portion 131A and the rear end portion 131B are end portions extending in X axis direction and oppose each other. The left end portion 131C and the right end portion 131D are end portions extending in Y axis direction and also oppose each other. Both ends of the left end portion 131C are respectively linked to one end of the front end portion 131A and to one end of the rear end portion 131B. Both ends of the right end portion 131D are respectively linked to the other end of the front end portion 131A and to the other end of the rear end portion 131B.

In the plan view, the base portion 130 has a substantially rectangular shape having the front end portion 131A and the rear end portion 131B as long sides and having the left end portion 131C and the right end portion 131D as short sides. The base portion 130 is formed substantially in plane symmetry with respect to an imaginary plane defined along a center line CL1 with respect to X axis direction that is a perpendicular bisector for the front end portion 131A and the rear end portion 131B. That is, it can be said that the base portion 130 is formed substantially in line symmetry with respect to the center line CL1. It is noted that the shape of the base portion 130 is not limited to a case of the rectangular shape illustrated in FIG. 3 and may be another shape configured substantially in line symmetry with respect to the center line CL1. For instance, the shape of the base portion 130 may be like a trapezoid in which one of the front end portion 131A and the rear end portion 131B is longer than the other. Further, at least one of the front end portion 131A, the rear end portion 131B, the left end portion 131C, and the right end portion 131D may be bent or curved.

According to an exemplary aspect, the imaginary plane corresponds to a symmetry plane for the vibrating portion 110 as a whole and the center line CL1 corresponds to a center line of the vibrating portion 110 as a whole with respect to X axis direction. Therefore, the center line CL1 is a line extending through a center of the vibrating arms 121A to 121D with respect to X axis direction and is located between the vibrating arm 121B and the vibrating arm 121C. Thus, in this aspect, the adjoining vibrating arms 121A and 121B are respectively formed in symmetry to the adjoining vibrating arms 121D and 121C with respect to the center line CL1.

In the base portion 130, a base portion length (also referred to as a "base length") that is the longest distance in Y axis direction between the front end portion 131A and the rear end portion 131B is on the order of 25 µm, for instance. Meanwhile, a base portion width (also referred to as a "base width") that is the longest distance in X axis direction between the left end portion 131C and the right end portion 131D is on the order of 180 µm, for instance. Incidentally, in the example illustrated in FIG. 3, the base portion length corresponds to a length of the left end portion 131C or the right end portion 131D and the base portion width corresponds to a length of the front end portion 131A or the rear end portion 131B.

The holding portion 140 (e.g., a frame) is configured so as to hold the vibrating portion 110. More particularly, the holding portion 140 is configured so that the vibrating arms 121A to 121D can vibrate. Specifically, the holding portion 140 is formed in plane symmetry with respect to the imaginary plane defined along the center line CL1. The holding portion 140 is shaped like a rectangular frame in the plan view and is placed so as to surround an outer side portion of the vibrating portion 110 along XY plane. Thus, the holding portion 140 surrounding the vibrating portion 110 can be easily implemented by provision of the shape of the frame in the plan view for the holding portion 140.

In an alternative aspect, it is sufficient if the holding portion 140 is placed in at least a portion of a periphery of the vibrating portion 110 and there is no limitation to the shape of the frame. For instance, it is sufficient if the holding portion 140 is placed in the periphery of the vibrating portion 110 to such an extent that the holding portion 140 can hold the vibrating portion 110 and can be jointed to the upper lid 30 and the lower lid 20.

In the exemplary embodiment, the holding portion 140 includes frame bodies 141A to 141D formed integrally. As illustrated in FIG. 3, the frame body 141A is provided so as to face the open ends of the vibrating arms 121A to 121D and so as to have a longitudinal direction parallel to X axis. The frame body 141B is provided so as to face the rear end portion 131B of the base portion 130 and so as to have a longitudinal direction parallel to X axis. The frame body 141C is provided so as to face the left end portion 131C of the base portion 130 and the vibrating arm 121A and so as to have a longitudinal direction parallel to Y axis and both ends thereof are connected to respective one ends of the frame bodies 141A and 141B. The frame body 141D is provided so as to face the right end portion 131D of the base portion 130 and the vibrating arm 121D and so as to have a longitudinal direction parallel to Y axis and both ends thereof are connected to the respective other ends of the frame bodies 141A and 141B. The frame bodies 141A and 141B face each other in Y axis direction with the vibrating portion 110 interposed therebetween. The frame bodies 141C and 141D face each other in X axis direction with the vibrating portion 110 interposed therebetween.

The support arm 151 is placed in the inner side portion of the holding portion 140 and makes a connection between the base portion 130 and the holding portion 140. The is, the support arm 151 has a first end connected to one of the base portion 130 and the holding portion 140 and a second end connected to the other of the base portion 130 and the holding portion 140. Moreover, the support arm 151 is formed so as not to be in line symmetry with respect to the center line CL1, that is, so as to be asymmetric in the plan view. Specifically, the support arm 151 includes a support rear arm 152 and a support side arm 153.

In the exemplary aspect, the support side arm 153 extends in parallel with the vibrating arm 121D between the vibrating arm 121D and the holding portion 140. Specifically, the support side arm 153 extends in Y axis direction from one end (e.g., a right end or end on a side of the frame body 141D) of the support rear arm 152 toward the frame body 141A, is bent in X axis direction, and is connected to the frame body 141D. That is, one end of the support arm 151 is connected to the holding portion 140.

The support rear arm 152 extends from the support side arm 153 between the rear end portion 131B of the base portion 130 and the holding portion 140. Specifically, the support rear arm 152 extends in Y axis direction from one end (e.g., a lower end or end on a side of the frame body 141B) of the support side arm 153 toward the frame body 141C. Further, the support rear arm 152 is bent in Y axis direction in a vicinity of a center of the base portion 130 with respect to X axis direction, extends therefrom in parallel with the center line CL1, and is connected to the rear end portion 131B of the base portion 130. That is, the other end of the support arm 151 is connected to the rear end portion 131B of the base portion 130.

The protruding portion 50 protrudes from the recessed portion 21 of the lower lid 20 into the vibration space. The protruding portion 50 is placed between the arm portion 123B of the vibrating arm 121B and the arm portion 123C of the vibrating arm 121C in the plan view. The protruding portion 50 extends in Y axis direction in parallel with the arm portions 123B and 123C and is formed in a shape of a prism. Moreover, the protruding portion 50 has a length on the order of 200 μm along Y axis direction and a length on the order of 15 μm along X axis direction according to an exemplary aspect. It is noted that the number of the protruding portions 50 is not limited to one and may be two or more. By placement of the protruding portion 50 between the vibrating arm 121B and the vibrating arm 121C and protrusion thereof from the bottom plate 22 of the recessed portion 21, rigidity of the lower lid 20 can be increased and occurrence of flexure of the resonator 10 formed above the lower lid 20 or a warp of the lower lid 20 can be reduced.

Figure 4:
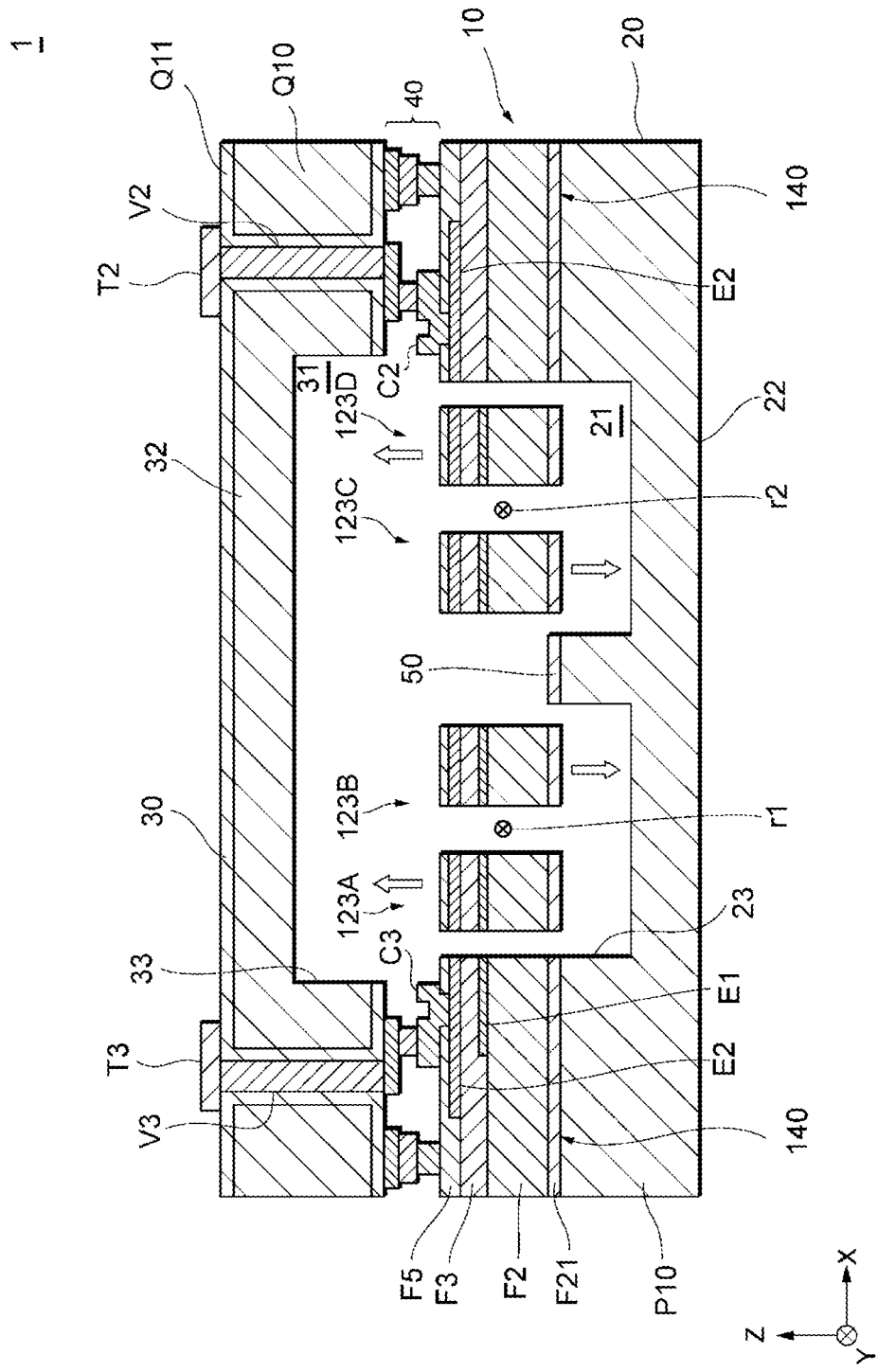
FIG. 4 is a sectional view, taken along X axis, generally illustrating a stacking structure of the resonance device illustrated in FIG. 1.
Figure 5:
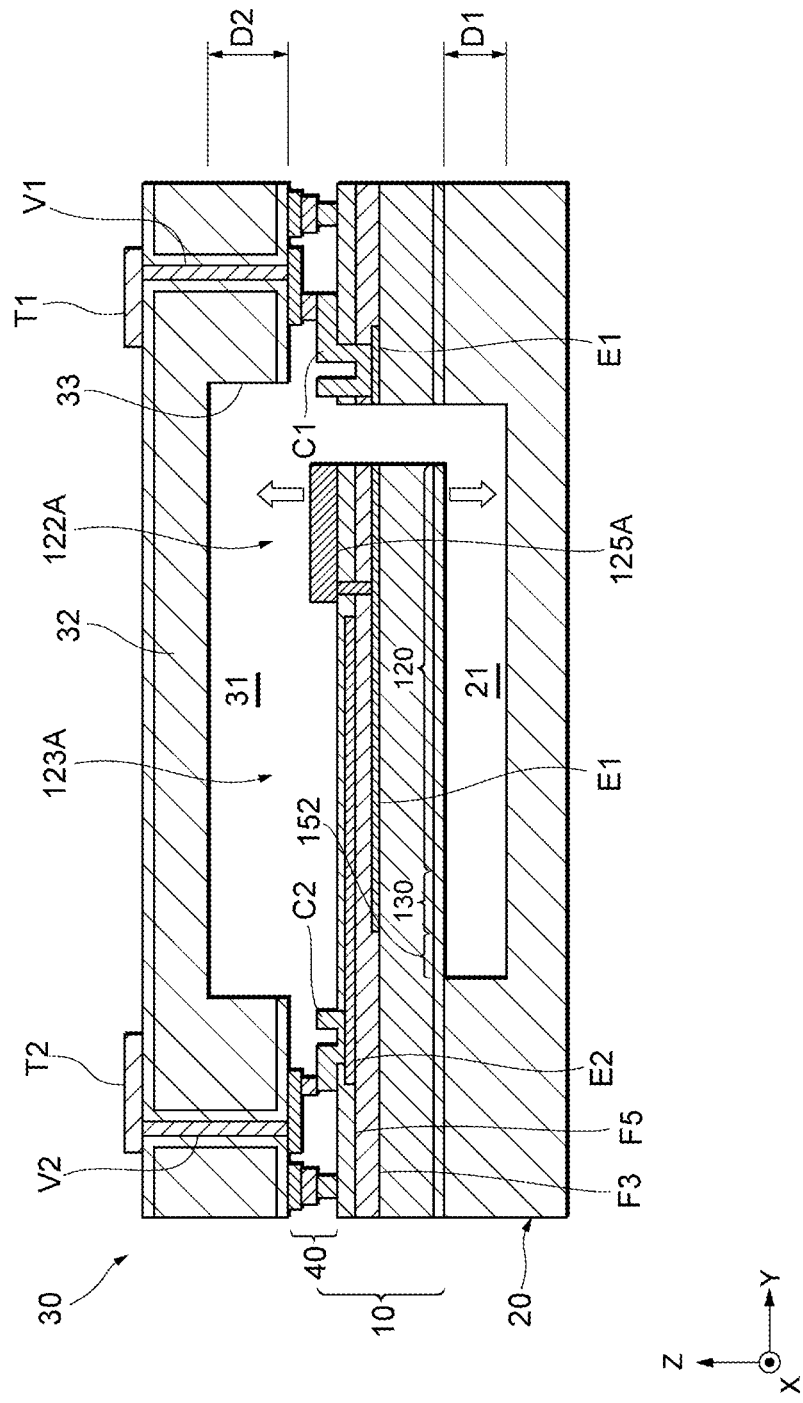
FIG. 5 is a sectional view, taken along Y axis, generally illustrating the stacking structure of the resonance device illustrated in FIG. 1.

Subsequently, a stacking structure and operation of the resonance device according to the first embodiment will be described with reference to FIGS. 4 and 5. FIG. 4 is a sectional view, taken along X axis, generally illustrating the stacking structure of the resonance device 1 illustrated in FIG. 1. FIG. 5 is a sectional view, taken along Y axis, generally illustrating the stacking structure of the resonance device 1 illustrated in FIG. 1.

In the resonance device 1, as illustrated in FIGS. 4 and 5, the holding portion 140 of the resonator 10 is jointed onto the side walls 23 of the lower lid 20 and then the holding portion 140 of the resonator 10 and the side walls 33 of the upper lid 30 are jointed. Thus, the resonator 10 is held between the lower lid 20 and the upper lid 30, so that the vibration space in which the vibrating portion 110 vibrates is formed by the lower lid 20, the upper lid 30, and the holding portion 140 of the resonator 10.

The vibrating portion 110, the holding portion 140, and the support arm portion 150 of the resonator 10 are integrally formed by an identical process. In the resonator 10, a metal film E1 is stacked on a Si substrate F2 that is an example of a substrate. Moreover, a piezoelectric film F3 is stacked on the metal film E1 so as to cover the metal film E1 and a metal film E2 is further stacked on the piezoelectric film F3. A protection film F5 is stacked on the metal film E2 so as to cover the metal film E2. In the mass addition portions 122A to 122D, furthermore, the aforementioned mass addition films 125A to 125D are each stacked on the protection film F5. Outer shapes of the vibrating portion 110, the holding portion 140, and the support arm portion 150 are formed by removal processing and patterning of a multilayer body composed of the aforementioned Si substrate F2, the metal film E1, the piezoelectric film F3, the metal film E2, the protection film F5, and the like through dry etching with irradiation with an argon (Ar) ion beam, for instance.

Though the example in which the resonator 10 includes the metal film E1 has been disclosed in the embodiment, the exemplary aspects are not limited to this configuration. In the resonator 10, for instance, the Si substrate F2 itself can be made to double as the metal film E1 with use of a degenerate silicon substrate, resulting in low resistance, as the Si substrate F2, so that the metal film E1 may be omitted.

In an exemplary aspect, the Si substrate F2 is formed of degenerate n-type silicon (Si) semiconductor with a thickness on the order of 6 µm, for instance, and may include phosphorus (P), arsenic (As), antimony (Sb), or the like as n-type dopant. Also, a resistance value of the degenerate silicon (Si) used for the Si substrate F2 is smaller than 1.6 mΩ·cm, for instance, and is smaller than or equal to 1.2 mΩ·cm, more preferably. Further, a silicon oxide layer F21 made of $SiO_2$ or the like, for instance, is formed as an example of a temperature characteristics correction layer on a lower surface of the Si substrate F2. Thus, temperature characteristics can be improved.

In the embodiment, the silicon oxide layer F21 refers to a layer having a function of reducing a temperature coefficient, that is, a changing rate per temperature of frequency in the vibrating portion 110 with the temperature correction layer formed on the Si substrate F2, at least in a vicinity of ordinary temperature, compared with a case where the silicon oxide layer F21 is not formed on the Si substrate F2. With the vibrating portion 110 having the silicon oxide layer F21, a change with temperature in a resonant frequency of a multilayer structure body made of the Si substrate F2, the metal films E1 and E2, the piezoelectric film F3, and the silicon oxide layer F21 can be reduced, for instance. The silicon oxide layer may be formed on an upper surface of the Si substrate F2 or may be formed on both the upper surface of and the lower surface of the Si substrate F2.

Preferably, the silicon oxide layers F21 of the mass addition portions 122A to 122D are formed with a uniform thickness. Incidentally, the uniform thickness means that a variation in the thicknesses of the silicon oxide layers F21 is within ±20% from an average value of the thicknesses.

The metal films E1 and E2 each includes an excitation electrode to excite the vibrating arms 121A to 121D and an extended electrode to make an electrical connection between the excitation electrode and an external power supply. Portions of the metal films E1 and E2 that function as the excitation electrodes face each other with the piezoelectric film F3 interposed therebetween in the arm portions 123A to 123D of the vibrating arms 121A to 121D. Portions of the metal films E1 and E2 that function as the extended electrodes extend through the support arm portion 150 and are derived from the base portion 130 to the holding portion 140, for instance. The metal film E1 is electrically continuous throughout the resonator 10. The metal film E2 is electrically isolated between portions formed in the vibrating arms 121A and 121D and portions formed in the vibrating arms 121B and 121C.

According to exemplary aspects, thicknesses of the metal films E1 and E2 are approximately 0.1 µm or more and 0.2 µm or less, for instance. The metal films E1 and E2 are patterned into the excitation electrodes, the extended electrodes, and the like by removal processing such as etching after film formation. The metal films E1 and E2 are formed from metal material whose crystal structure is a body-centered cubic structure, for instance. Specifically, the metal films E1 and E2 are formed with use of molybdenum (Mo), tungsten (W), or the like. Thus, the metal films E1 and E2 that are suitable for lower electrodes and upper electrodes of the resonator 10 can be easily implemented with use of metal whose crystal structure is the body-centered cubic structure, as a main component.

The piezoelectric film F3 is a thin film formed from a type of piezoelectric material that makes an interconversion between electric energy and mechanical energy. The piezoelectric film F3 expands and contracts in Y axis direction among in-plane directions in XY plane in accordance with an electric field formed in the piezoelectric film F3 by the metal films E1 and E2. With such expansion and contraction of the piezoelectric film F3, the vibrating arms 121A to 121D each displace the open ends toward the bottom plate 22 of the lower lid 20 and the bottom plate 32 of the upper lid 30. Thus, the resonator 10 vibrates in the out-of-plane bending vibration mode.

Though a thickness of the piezoelectric film F3 is on the order of 1 µm, for instance, the thickness may be on the order of 0.2 µm to 2 µm in exemplary aspects. Moreover, the piezoelectric film F3 can be formed from material having a crystal structure of wurtzite-type hexagonal crystal structure and may include nitride or oxide such as aluminum nitride (AlN), scandium aluminum nitride (ScAlN), zinc oxide (ZnO), gallium nitride (GaN), or indium nitride (InN), for instance, as a main component. Incidentally, scandium aluminum nitride is made by substitution of scandium for a portion of aluminum in aluminum nitride and two elements such as magnesium (Mg) and niobium (Nb) or magnesium (Mg) and zirconium (Zr) may be substituted instead of scandium. Thus, the piezoelectric film F3 includes the piezoelectric material having the crystal structure of the wurtzite-type hexagonal crystal structure as the main component, so that the piezoelectric film F3 that is suitable for the resonator 10 can be easily implemented.

The protection film F5 protects the metal film E2 from oxidation. Incidentally, the protection film F5 does not have to be exposed to the bottom plate 32 of the upper lid 30 as long as the protection film F5 is provided on a side of the upper lid 30. For instance, a parasitic capacitance reduction film to reduce capacitance of interconnections formed in the resonator 10 or the like may be formed so as to cover the protection film F5. The protection film F5 is formed of a piezoelectric film such as aluminum nitride (AlN), scandium aluminum nitride (ScAlN), zinc oxide (ZnO), gallium nitride (GaN), or indium nitride (InN) or an insulating film such as silicon nitride (SiN), silicon oxide ($SiO_2$), alumina oxide ($Al_2O_3$), or tantalum pentoxide ($Ta_2O_5$), for instance. A thickness of the protection film F5, formed with a length that is smaller than or equal to half of the thickness of the piezoelectric film F3, is on the order of 0.2 µm, for instance, in the embodiment. Incidentally, a more preferable thickness of the protection film F5 is on the order of a quarter of the thickness of the piezoelectric film F3. Furthermore, in case where the protection film F5 is formed of piezoelectric material such as aluminum nitride (AlN), the piezoelectric material having the same orientation as the piezoelectric film F3 has is preferably used.

In an exemplary aspect, the protection film F5 in the mass addition portions 122A to 122D preferably should be formed with a uniform thickness. Incidentally, the uniform thickness means that a variation in the thicknesses of the protection film F5 is within ±20% from an average value of the thicknesses.

The mass addition films 125A to 125D configure surfaces of the mass addition portions 122A to 122D on a side of the upper lid 30 and correspond to the frequency regulation films of the vibrating arms 121A to 121D, respectively. A resonant frequency of the resonator 10 is regulated with trimming processing in which a portion is removed from each of the mass addition films 125A to 125D. The mass addition films 125A to 125D are preferably formed from material having a mass reduction velocity with etching higher than the protection film F5 has, in terms of efficiency of frequency regulation. The mass reduction velocity is expressed by a product of etching velocity and density. The etching velocity is a thickness that is removed per unit time. Between the protection film F5 and the mass addition films 125A to 125D, magnitude relation of the etching velocity does not matter as long as relation of the mass reduction velocity is as described above. In addition, the mass addition films 125A to 125D are preferably formed from material having a large specific gravity in terms of efficient increase in weights of the mass addition portions 122A to 122D. For these reasons, the mass addition films 125A to 125D are formed from metal material such as molybdenum (Mo), tungsten (W), gold (Au), platinum (Pt), nickel (Ni), aluminum (Al), or titanium (Ti), for instance.

Portions of upper surfaces of the mass addition films 125A to 125D have been removed with trimming processing in a step of regulating the frequency. In an exemplary aspect, the trimming processing for the mass addition films 125A to 125D can be carried out through the dry etching with irradiation with an argon (Ar) ion beam, for instance. An ion beam is superior in processing efficiency because of capability of irradiation of a broad area, whereas there is a fear that the mass addition films 125A to 125D may be charged because the beam carries a charge. The mass addition films 125A to 125D are preferably grounded in order that the vibration characteristics of the resonator 10 may be prevented from being deteriorated with changes in vibratory tracks of the vibrating arms 121A to 121D that may be caused by a coulomb interaction with charging of the mass addition films 125A to 125D.

Extended lines C1, C2, and C3 are formed on the protection film F5 of the holding portion 140. The extended line C1 is electrically connected to the metal film E1 through a through-hole formed on the piezoelectric film F3 and the protection film F5. The extended line C2 is electrically connected to portions of the metal film E2, formed in the vibrating arms 121A and 121D, through through-holes formed on the protection film F5. The extended line C3 is electrically connected to portions of the metal film E2, formed in the vibrating arms 121B and 121C, through through-holes formed on the protection film F5. In exemplary aspects, the extended lines C1 to C3 can be formed from metal material such as aluminum (Al), germanium (Ge), gold (Au), or tin (Sn).

Though the example in which the arm portions 123A to 123D, the extended lines C2 and C3, penetrating electrodes V2 and V3, and the like are located on a cross-section on an identical plane is illustrated in FIG. 4 in the embodiment, these are not necessarily located on a cross-section on an identical plane. For instance, the penetrating electrodes V2 and V3 may be formed at positions that are apart in Y axis direction from a cross-section which is parallel to ZX plane defined by Z axis and X axis and which sections the arm portions 123A to 123D.

Similarly, though the example in which the mass addition portion 122A, the arm portion 123A, the extended lines C1 and C2, penetrating electrodes V1 and V2, and the like are located on a cross-section on an identical plane is illustrated in FIG. 5 in the embodiment, these are not necessarily located on a cross-section on an identical plane.

The bottom plate 22 and the side walls 23 of the lower lid 20 are integrally formed as a Si substrate P10. The Si substrate P10 is formed of non-degenerate silicon having a resistivity greater than or equal to 10 Ω·cm, for instance. The Si substrate P10 is exposed in an inner side portion in the recessed portion 21 of the lower lid 20. The silicon oxide layer F21 is formed on an upper surface of the protruding portion 50. On the upper surface of the protruding portion 50, however, the Si substrate P10 having the lower electric resistivity than the silicon oxide layer F21 has may be exposed or a conductive layer may be formed in terms of reduction in charging in the protruding portion 50.

Moreover, in an exemplary aspect, a thickness of the lower lid 20 defined in Z axis direction is on the order of 150 μm and a depth of the recessed portion 21 defined similarly is on the order of 50 μm, for example.

Moreover, the bottom plate 32 and the side walls 33 of the upper lid 30 can be integrally formed as a Si substrate Q10. A front surface, a back surface, and inside surfaces of through-holes of the upper lid 30 are preferably covered with a silicon oxide film Q11. The silicon oxide film Q11 is formed on the surfaces of the Si substrate Q10 by oxidation of the Si substrate Q10 or chemical vapor deposition (CVD), for instance. The Si substrate Q10 is exposed in an inner side portion in the recessed portion 31 of the upper lid 30. In an exemplary aspect, a getter layer may be formed on a surface of the recessed portion 31 of the upper lid 30 on a side facing the resonator 10. The getter layer is formed of titanium (Ti) or the like, for instance, and absorbs outgas released from a joint portion 40 or the like that will be 34escrybed later so as to reduce loss of vacuum in the vibration space. Incidentally, the getter layer may be formed on a surface of the recessed portion 21 of the lower lid 20 on a side facing the resonator 10 or may be formed on the surfaces of both the recessed portion 21 of the lower lid 20 and the recessed portion 31 of the upper lid 30 on the side facing the resonator 10.

A thickness of the upper lid 30 defined in Z axis direction is on the order of 150 μm and a depth of the recessed portion 31 defined similarly is on the order of 50 μm, for example.

As further shown, terminals T1, T2, and T3 are formed on an upper surface (e.g., a surface on a side opposed to the surface facing the resonator 10) of the upper lid 30. The terminal T1 is a mounting terminal to ground the metal film E1. The terminal T2 is a mounting terminal to electrically connect the metal film E2 of the vibrating arms 121A and 121D to the external power supply. The terminal T3 is a mounting terminal to electrically connect the metal film E2 of the vibrating arms 121B and 121C to the external power supply. The terminals T1 to T3 are each formed of a metallization layer (e.g., a foundation layer) of chromium (Cr), tungsten (W), nickel (Ni), or the like plated with nickel (Ni), gold (Au), silver (Ag), copper (Cu), or the like, for instance. Incidentally, a dummy terminal electrically insulated from the resonator 10 may be formed on the upper surface of the upper lid 30, for a purpose of regulating a parasitic capacitance or a mechanical strength balance according to exemplary aspects.

The penetrating electrodes V1, V2, and V3 are formed in the side walls 33 of the upper lid 30. The penetrating electrode V1 makes an electrical connection between the terminal T1 and the extended line C1, the penetrating electrode V2 makes an electrical connection between the terminal T2 and the extended line C2, and the penetrating electrode V3 makes an electrical connection between the terminal T3 and the extended line C3. The penetrating electrodes V1 to V3 are formed by filling with conductive material in the through-holes penetrating the side walls 33 of the upper lid 30 in Z axis direction. The conductive material for the filling is polycrystalline silicon (Poly-Si), copper (Cu), gold (Au), or the like, for instance.

The joint portion 40 is formed between the side walls 33 of the upper lid 30 and the holding portion 140 and the upper lid 30 is jointed to the resonator 10 by the joint portion 40. The joint portion 40 is formed in a shape of a closed loop surrounding the vibrating portion 110 in XY plane, so as to airtightly seal the vibration space for the resonator 10 in the vacuum state. The joint portion 40 is formed of a metal film in which aluminum (Al) film, germanium (Ge) film, and aluminum (Al) film are stacked in order of mention and are eutectically bonded, for instance. Incidentally, the joint portion 40 may be formed of a combination of film selected appropriately from gold (Au), tin (Sn), copper (Cu), titanium (Ti), silicon (Si), and the like. Further, the joint portion 40 may include a metal compound such as titanium nitride (TiN), tantalum nitride (TaN), or the like between the films, for improvement in close contact property.

In the embodiment, the terminal T1 is grounded and alternating voltages opposed in phase to each other are applied to the terminals T2 and T3. Therefore, phases of an electric field formed in the piezoelectric film F3 of the vibrating arms 121A and 121D and phases of an electric field formed in the piezoelectric film F3 of the vibrating arms 121B and 121C are opposed to each other. Thus, the vibrating arms 121A and 121D in the outer side portions and the vibrating arms 121B and 121C in the inner side portion are displaced in directions opposed to each other.

When the mass addition portions 122A, 122D and the arm portions 123A, 123D of the vibrating arms 121A, 121D are displaced toward an inside surface of the upper lid 30 as illustrated in FIG. 4, for instance, the mass addition portions 122B, 122C and the arm portions 123B, 123C of the vibrating arms 121B, 121C are displaced toward an inside surface of the lower lid 20. When the mass addition portions 122A, 122D and the arm portions 123A, 123D of the vibrating arms 121A, 121D are inversely displaced toward the inside surface of the lower lid 20, though illustration is omitted, the mass addition portions 122B, 122C and the arm portions 123B, 123C of the vibrating arms 121B, 121C are displaced toward the inside surface of the upper lid 30. Accordingly, at least two of the four vibrating arms 121A to 121D bend out of plane with different phases in the exemplary aspect during operation.

In relation between the adjoining vibrating arms 121A and 121B, in this manner, the vibrating arm 121A and the vibrating arm 121B vibrate upward and downward in opposite directions around a center axis r1 extending in Y axis direction. In relation between the adjoining vibrating arms 121C and 121D, meanwhile, the vibrating arm 121C and the vibrating arm 121D vibrate upward and downward in opposite directions around a center axis r2 extending in Y axis direction. Consequently, torsional moments in opposite directions are caused for the center axis r1 and the center axis r2, so that bending vibrations in the vibrating portion 110 are produced. Maximum amplitudes of the vibrating arms 121A to 121D are on the order of 50 µm and amplitudes thereof at time of normal driving are on the order of 10 µm.

In the resonator 10, a frequency regulation step for fine regulation of the resonant frequency by overexcitation is carried out in addition to the regulation of the resonant frequency by the trimming processing described above. In the frequency regulation step, the resonant frequency is initially measured in a state in which a drive voltage of a specified value is applied to the resonator 10 and a voltage higher than the drive voltage of the specified value is applied to the resonator 10 so as to cause the overexcitation of the vibrating arms 121 on condition that the measured resonant frequency is lower than a desired value. Electric power to be applied to the resonator 10 in the frequency regulation step is higher than or equal to 0.2 µW, for instance. Incidentally, the overexcitation refers to vibrating the resonator 10 with an amplitude ten or more times a usual amplitude and a specific amplitude at time of the overexcitation is greater than or equal to 50 µm.

The overexcitation of the vibrating arms 121 causes each of the mass addition films 125A to 125D on the vibrating arms 121 to collide with at least either of the bottom plate 32 or the getter layer of the upper lid 30 and the bottom plate 22 of the lower lid 20. The bottom plate 32 or the getter layer of the upper lid 30 is formed of a material having a hardness higher than a hardness of the mass addition films 125A to 125D and thus collisions of the mass addition films 125A to 125D with the bottom plate 32 or the getter layer scrape the mass addition films 125A to 125D and reduce mass of the vibrating arms 121. Similarly, at least either of the Si substrate F2 and the silicon oxide layers F21 that are formed on the surfaces (e.g., back surfaces) of the vibrating arms 121 on a side of the lower lid 20 have a lower hardness than the bottom plate 22 has. Therefore, the mass of the vibrating arms 121 can be reduced by scraping the Si substrate F2 or the silicon oxide layers F21 on the back surfaces of the vibrating arms 121 as well. Thus, reduction in the mass of the vibrating arms 121 heightens the resonant frequency of the resonator 10.

After the vibrating arms 121 are made to collide with at least either of the upper lid 30 and the lower lid 20 by the overexcitation of the resonator 10, the drive voltage of the specified value is applied afresh to the resonator 10 and the resonant frequency is measured. Measurement of the resonant frequency with application of the drive voltage of the specified value to the resonator 10 and the overexcitation of the resonator 10 by application of a voltage higher than the drive voltage to the resonator 10 are iterated, until the measured resonant frequency reaches the desired value, so that a value of the resonant frequency of the resonator 10 is regulated so as to be the appropriate value.

Thus, the frequency regulation step with the overexcitation has advantages in that the resonant frequency of the resonator 10 can be regulated even after packaging with the lower lid 20 and the upper lid 30, in that fluctuation in the resonant frequency can be reduced because there is no processing step involving a thermal load or stress loading after the frequency regulation step, and in that a desired resonant frequency is prone to be attained because the resonant frequency can be regulated while being measured.

Meanwhile, a resonator may have a structure in which a vibrating portion such as a support arm is asymmetrical in the plan view, for a purpose of improvement in DLD. In this case, a plurality of vibrating arms supported by the support arm may be prevented from vibrating flatly with respect to an upper lid and a lower lid in the frequency regulation step with the overexcitation. Accordingly, there may occur a bias in amounts of scraping on the plurality of vibrating arms, such as a large amount of scraping on an outer arm and a small amount of scraping on an inner arm among the plurality of vibrating arms, when the vibrating arms are made to collide with at least either of the upper lid and the lower lid by being vibrated by the overexcitation. As a result, there has been a fear that regulation time for attainment of the desired resonant frequency may be prolonged, that is, the regulation rate for the resonant frequency may be decreased.

In view of the foregoing, the inventors of the present invention have found that both the improvement in DLD and inhibition against the decrease in the regulation rate are attained on condition that the support arm is connected to a position in a specified range on the base portion and on condition that a length of the support arm is in a specified range.

Figure 6:
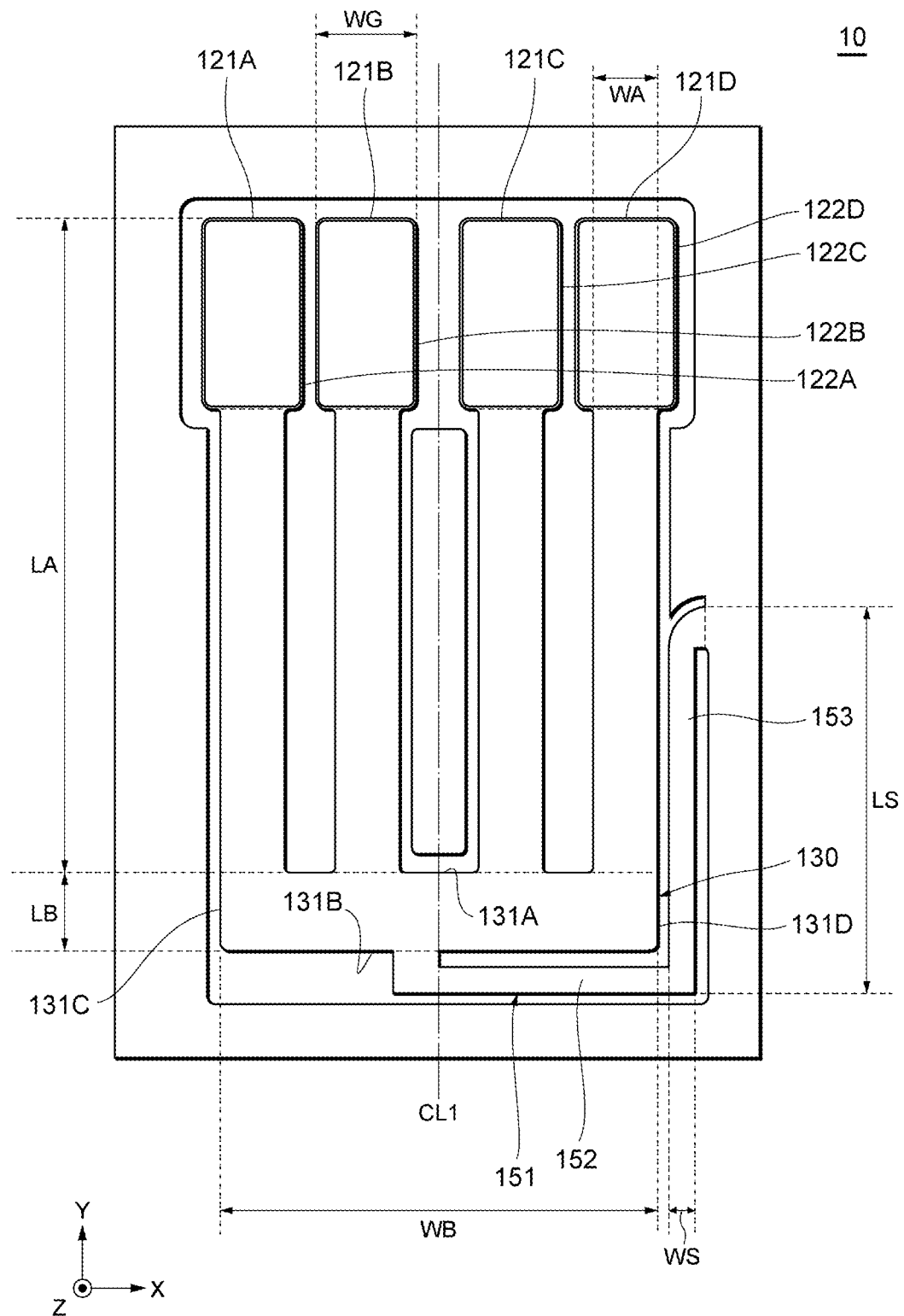
FIG. 6 is a plan view for description of sizes of the resonator illustrated in FIG. 3.

Subsequently, sizes of the vibrating portion in the plan view will be described with reference to FIG. 6. FIG. 6 is a plan view for description of the sizes of the resonator 10 illustrated in FIG. 3. Incidentally, in FIG. 6, a portion of the resonator 10 is illustrated for simplification of description.

In the resonator 10 of the embodiment, as illustrated in FIG. 6, a width WG that is a length of each of the mass addition portions 122A to 122D in a direction along X axis direction is 49 μm, for instance. Further, a vibrating arm width WA that is a length of each of the vibrating arms 121A to 121D in a direction along X axis direction is 26 μm, for instance, and a vibrating arm length LA that is a length of each of the vibrating arms 121A to 121D in a direction along Y axis direction is 410 μm, for instance.

Further, a base portion length LB that is a length of the base portion 130 in a direction from the front end portion 131A toward the rear end portion 131B is 25 μm, for instance. Meanwhile, a base portion width WB that is a length thereof in a direction from the left end portion 131C toward the right end portion 131D is 176 μm, for instance.

Further, a support arm width WS that is a width of the support arm 151, specifically, a length of the support side arm 153 in a direction along X axis direction is 20 μm, for instance, and a support arm length LS that is a length of the support arm 151, specifically, a length of the support side arm 153 in a direction along Y axis direction is 125 μm, for instance.

The other end of the support arm 151, specifically, the other end of the support rear arm 152 is connected to a position on the rear end portion 131B of the base portion 130 that is deviated by 10 μm to a negative side in X axis direction, that is, a left side from a position, as a reference, where the center line CL1 passes. In following description, the position on the rear end portion 131B of the base portion 130 where the center line CL1 passes is set as an origin (zero) and one side (right side) thereof is represented by "+" (plus) and the other side (left side) thereof is represented by "−" (minus), unless otherwise stated. That is, the other end of the support rear arm 152 is connected to the position of −10 μm on the rear end 131B of the base portion 130 with respect to the position where the center line CL1 passes, in an example illustrated in FIG. 6. That is, the other end of the support rear arm 152 is connected to the left of the center line CL1.

Further, in the following description, sizes of portions are assumed to be lengths described with use of FIG. 6, unless otherwise stated.

Figure 7:
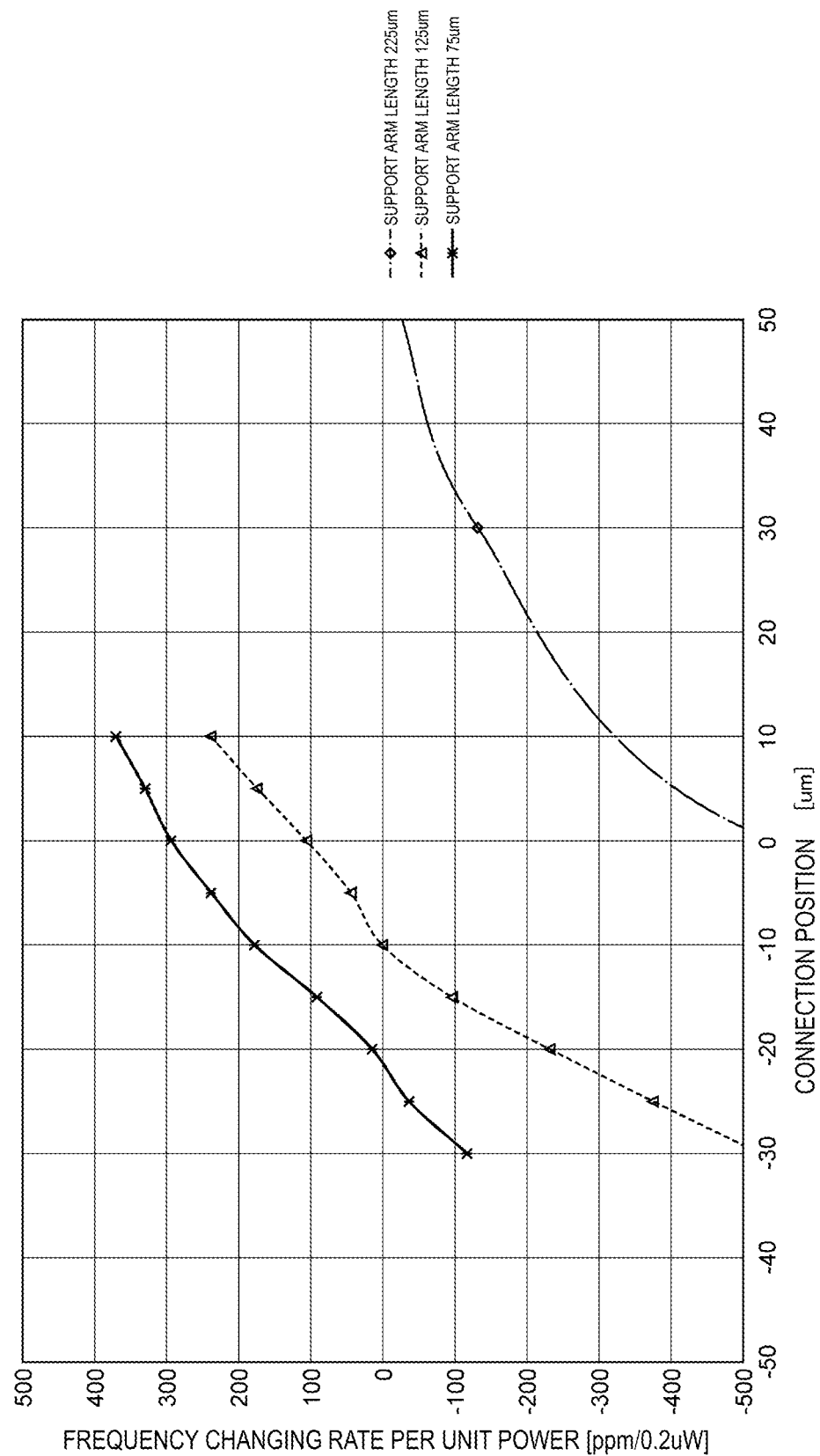
FIG. 7 is a graph illustrating relation between connection positions of a support arm with different support arm lengths of the support arm on a base portion and frequency changing rates per unit power.
Figure 8:
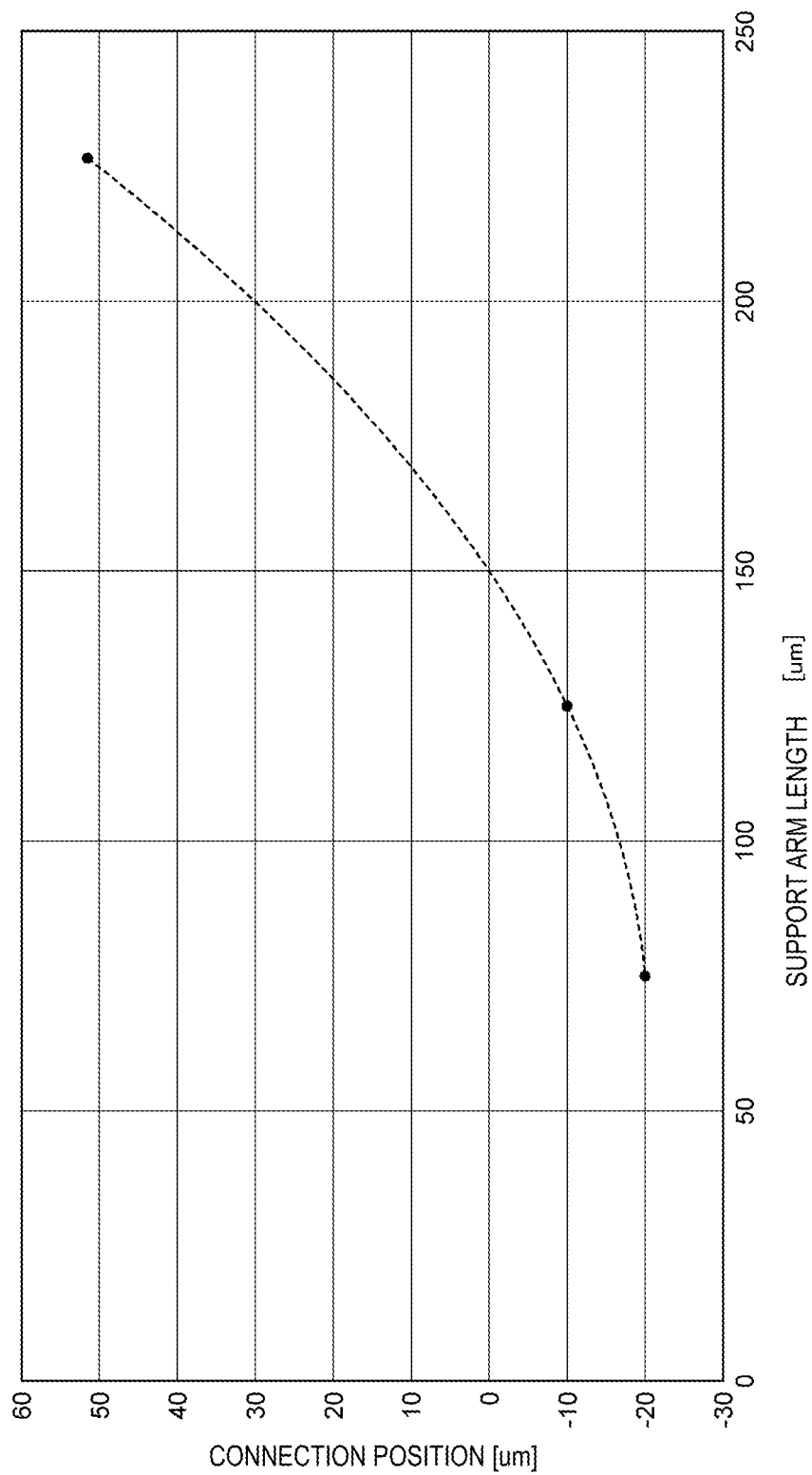
FIG. 8 is a graph illustrating relation between support arm lengths of the support arm and connection positions of the support arm on the base portion.

Subsequently, relation among the connection positions on the base portion for the support arm and the support arm lengths of the support arm and DLD will be described with reference to FIGS. 7 and 8. FIG. 7 is a graph illustrating relation between connection positions of the support arm 151 with different support arm lengths LS of the support arm 151 on the base portion 130 and frequency changing rates per unit power. FIG. 8 is a graph illustrating relation between support arm lengths LS of the support arm 151 and connection positions of the support arm 151 on the base portion 130. In FIG. 7, a horizontal axis represents the connection positions of the support arm 151 relative to the position of zero on the rear end portion 131B of the base portion 130 where the center line CL1 passes with the one side (e.g., the right side) of the center line CL1 defined as positive and with the other side (e.g., the left side) of the center line CL1 defined as negative. A vertical axis represents the frequency changing rate (df/f) in the resonant frequency (f) per unit power (0.2 μW), which is the index of DLD. Further, lines in FIG. 7 are lines on conditions that the respective support arm lengths LS of the support arm 151 are 225 μm, 125 μm, and 75 μm. In FIG. 8, a horizontal axis represents the support arm lengths LS of the support arm 151 and a vertical axis represents the connection positions of the support arm 151 relative to the position of zero on the rear end portion 131B of the base portion 130 where the center line CL1 passes with the one side (e.g., the right side) of the center line CL1 defined as positive and with the other side (e.g., the left side) of the center line CL1 defined as negative.

As illustrated in FIG. 7, the frequency changing rate per unit power can be made zero or substantially made zero for all the support arm lengths LS by regulation of the connection position of the support arm 151. Specifically, the frequency changing rate per unit power is made zero or substantially made zero on conditions that the connection position of the support arm 151 is 51.5 μm with the support arm length LS of the support arm 151 being 225 μm, that the connection position of the support arm 151 is −10 μm with the support arm length LS of the support arm 151 being 125 μm, and that the connection position of the support arm 151 is −20 μm with the support arm length LS of the support arm 151 being 75 μm.

Based on these combinations, the DLD of the resonator 10 is improved on condition that the support arm length LS of the support arm 151 and the connection position of the support arm 151 satisfy the relation illustrated by a dotted line in FIG. 8.

Figure 9:
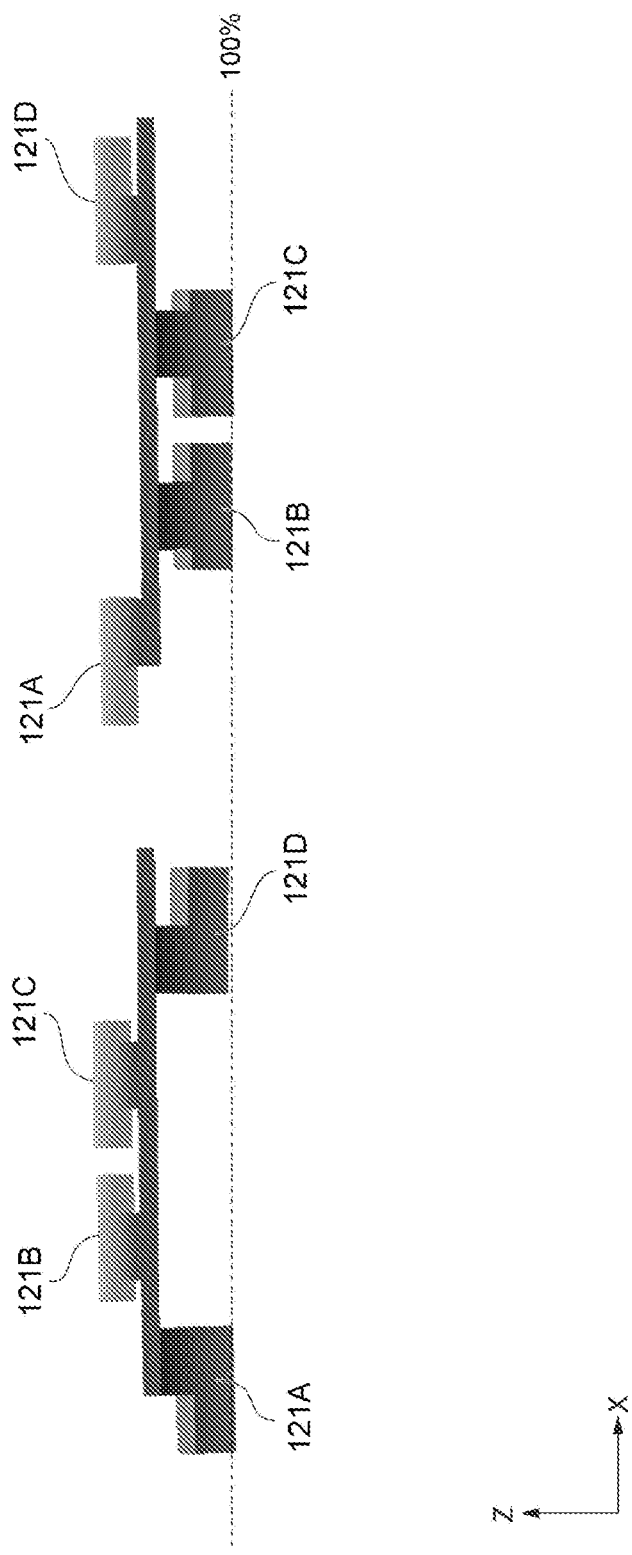
FIG. 9 is a sectional view schematically illustrating amounts of displacement of vibrating arms under a condition that the connection position of the support arm is −10 μm.
Figure 10:
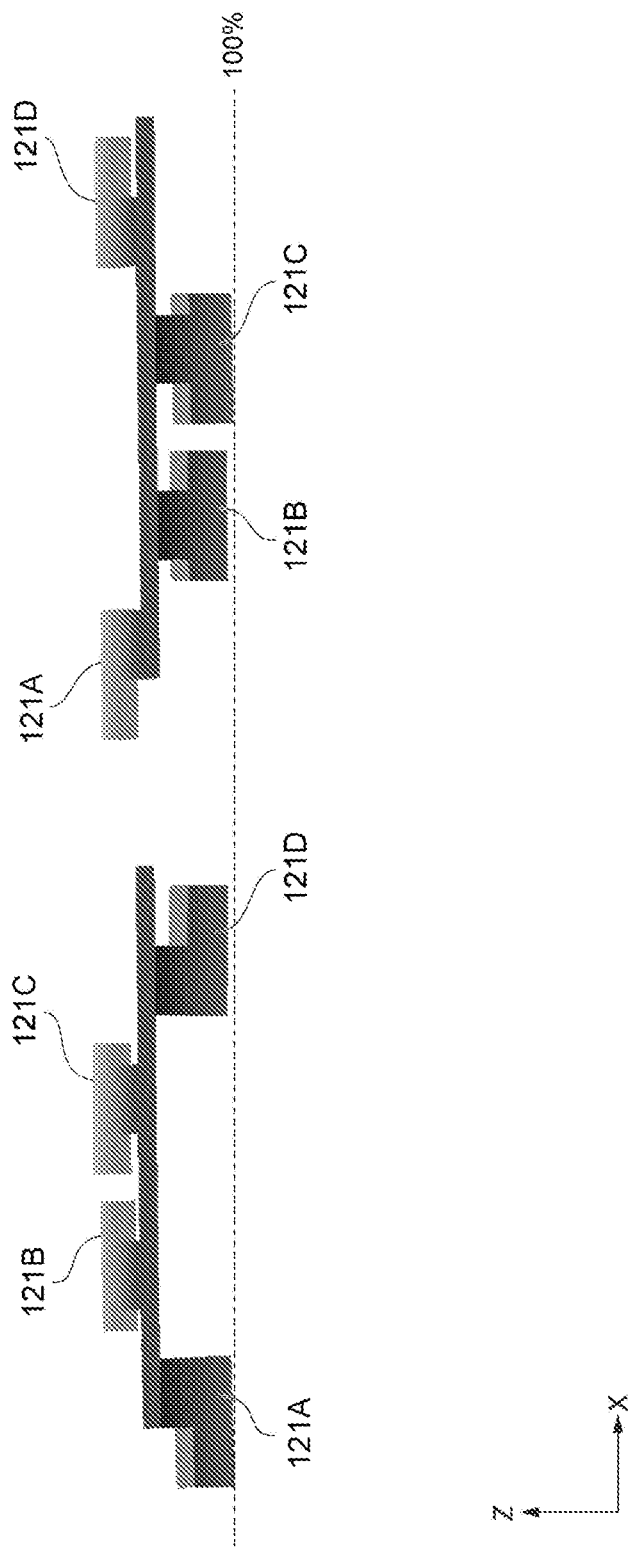
FIG. 10 is a sectional view schematically illustrating amounts of displacement of vibrating arms under a condition that the connection position of the support arm is −50 μm.
Figure 11:
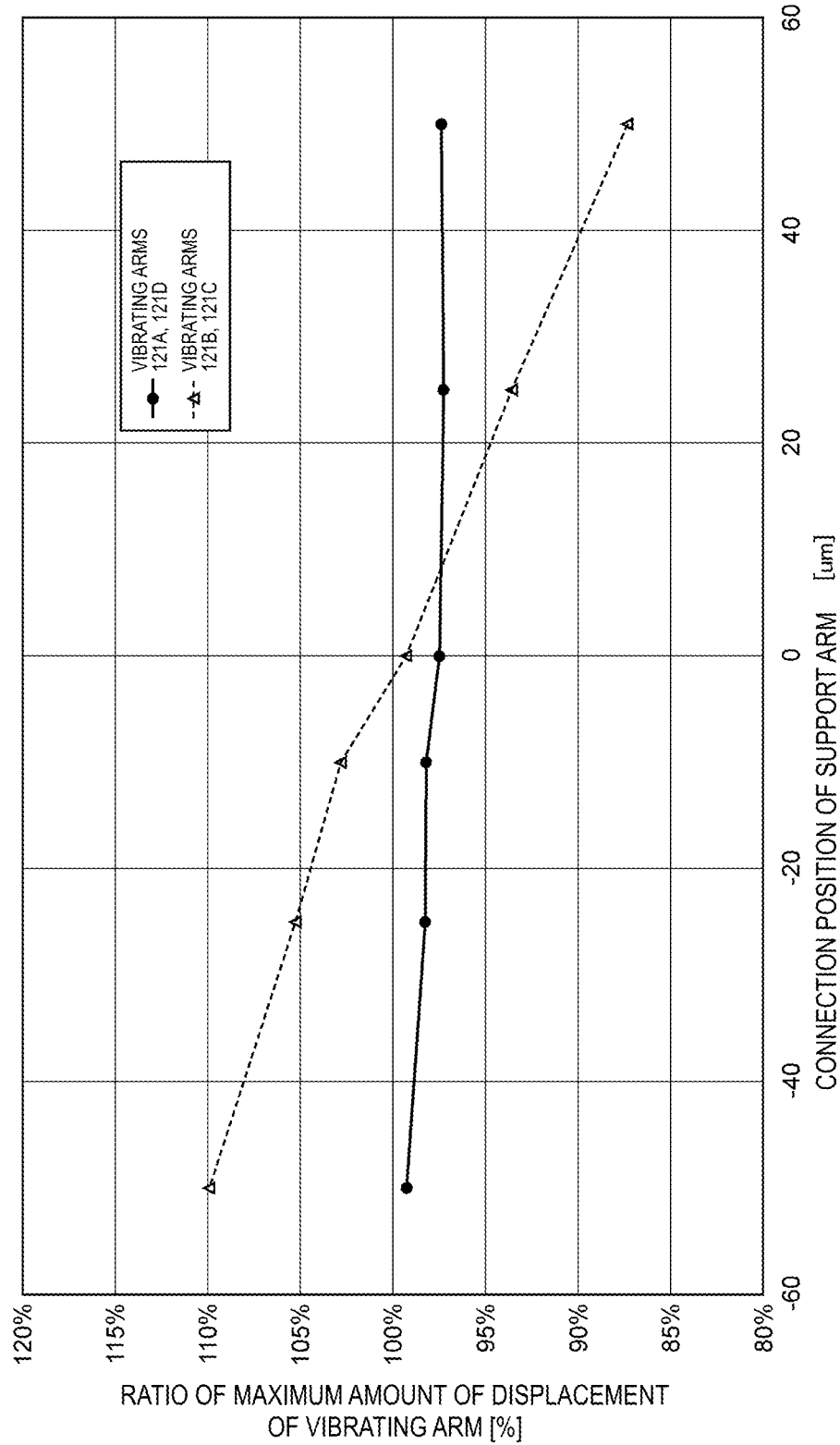
FIG. 11 is a graph illustrating relation between the connection positions of the support arm on the base portion and the amounts of displacement of the vibrating arms.

Subsequently, displacement due to the vibrations of the vibrating arms will be described with reference to FIGS. 9 to 11. FIG. 9 is a sectional view schematically illustrating amounts of displacement of the vibrating arms 121A to 121D under a condition that the connection position of the support arm 151 is −10 μm. FIG. 10 is a sectional view schematically illustrating amounts of displacement of the vibrating arms 121A to 121D under a condition that the connection position of the support arm 151 is −50 μm. FIG. 11 is a graph illustrating relation between the connection positions of the support arm 151 on the base portion 130 and the amounts of displacement of the vibrating arms 121A to 121D. Incidentally, in the vibrating arms 121A to 121D illustrated in FIGS. 9 and 10, areas with dark colors indicate that the amounts of the displacement are large and areas with light colors indicate that the amounts of the displacement are small. In FIG. 11, a horizontal axis represents the connection positions of the support arm 151 relative to the position of zero on the rear end portion 131B of the base portion 130 where the center line CL1 passes with the one side (e.g., the right side) of the center line CL1 defined as positive and with the other side (e.g., the left side) of the center line CL1 defined as negative. Further, a vertical axis represents ratios (%) of maximum amounts of displacement of the vibrating arms 121A to 121D with respect to a reference (100%) that is a maximum amount of displacement of vibrating arms of a hypothetical resonator having a support arm which is symmetrical with respect to a center line.

In operation, when the vibrating arms 121 vibrate in the out-of-plane bending vibration mode, the vibrating arms 121A to 121D are displaced principally in Z axis direction. Specifically, the vibrating arms 121B and 121C are displaced to the positive side in Z axis direction when the vibrating arms 121A and 121D are displaced to the negative side in Z axis direction, as illustrated on a left side in FIGS. 9 and 10. Adversely, the vibrating arms 121B and 121C are displaced to the negative side in Z axis direction when the vibrating arms 121A and 121D are displaced to the positive side in Z axis direction, as illustrated on a right side in FIGS. 9 and 10. Further, it is observed from FIGS. 9 and 10 that the amounts of displacement of the vibrating arms 121A and 121D or the vibrating arms 121B and 121C are maximized when being displaced to the negative side in Z axis direction.

As illustrated in FIG. 11, the maximum amounts of displacement of the vibrating arms 121A and 121D undergo relatively small changes with a change in the connection position of the support arm 151 and have values between 95% and 100% for the connection positions of the support arm 151 in a range from −50 μm to 50 μm. Further, it is observed that the maximum amounts of displacement of the vibrating arms 121A and 121D are closest to 100% on condition that the connection position of the support arm 151 is −50 μm. Meanwhile, the maximum amounts of displacement of the vibrating arms 121B and 121C undergo relatively large changes with a change in the connection position of the support arm 151 and have values between 110% and 85% for the connection positions of the support arm 151 in the range from −50 μm to 50 μm. Further, it is observed that the maximum amounts of displacement of the vibrating arms 121B and 121C are closest to 100% on condition that the connection position of the support arm 151 is in a vicinity of −5 μm.

Figure 12:
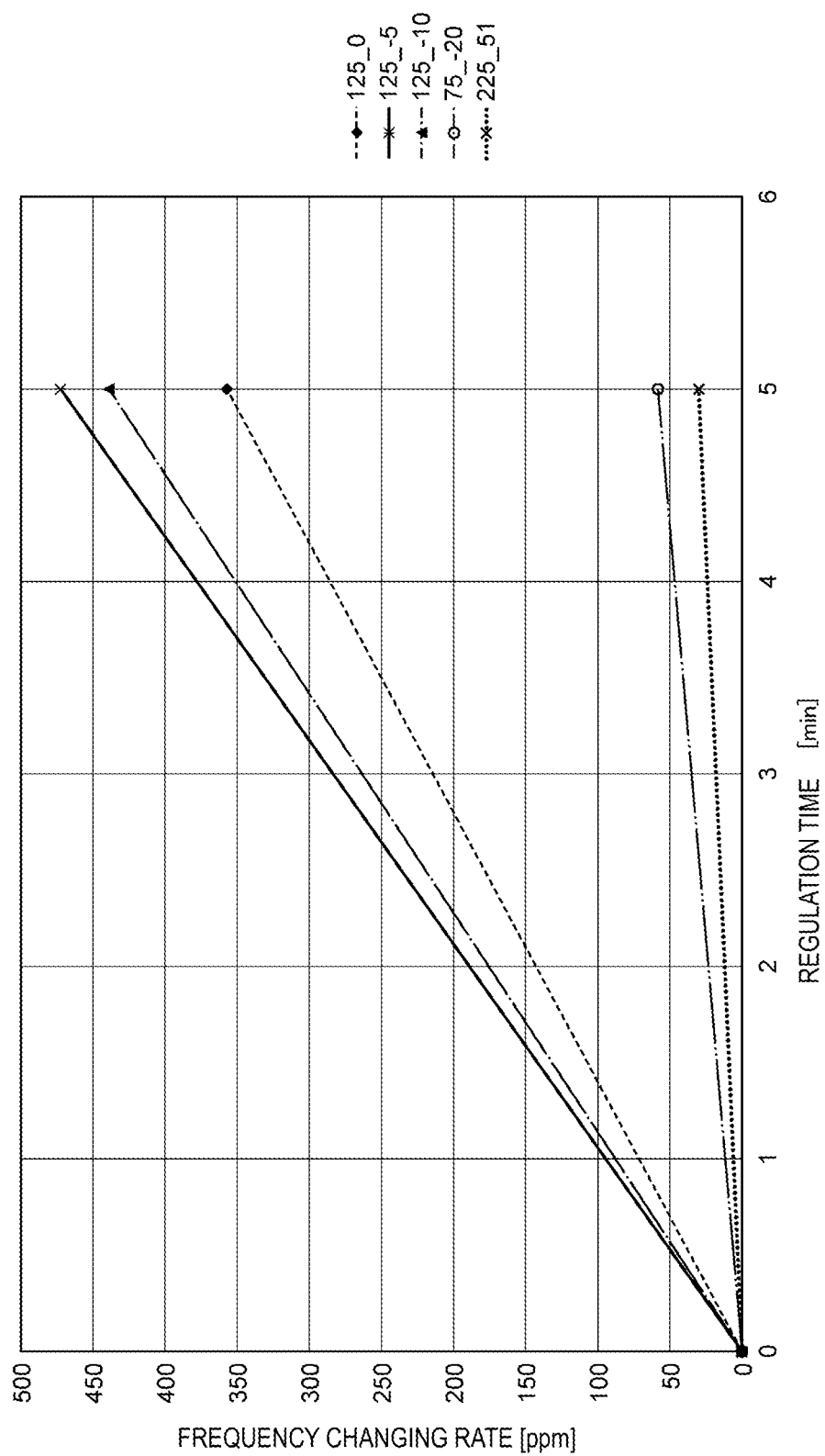
FIG. 12 is a graph illustrating relation between regulation time for a resonant frequency with use of overexcitation and changing rates in the resonant frequency, with different support arm lengths of the support arm and different connection positions of the support arm.
Figure 13:
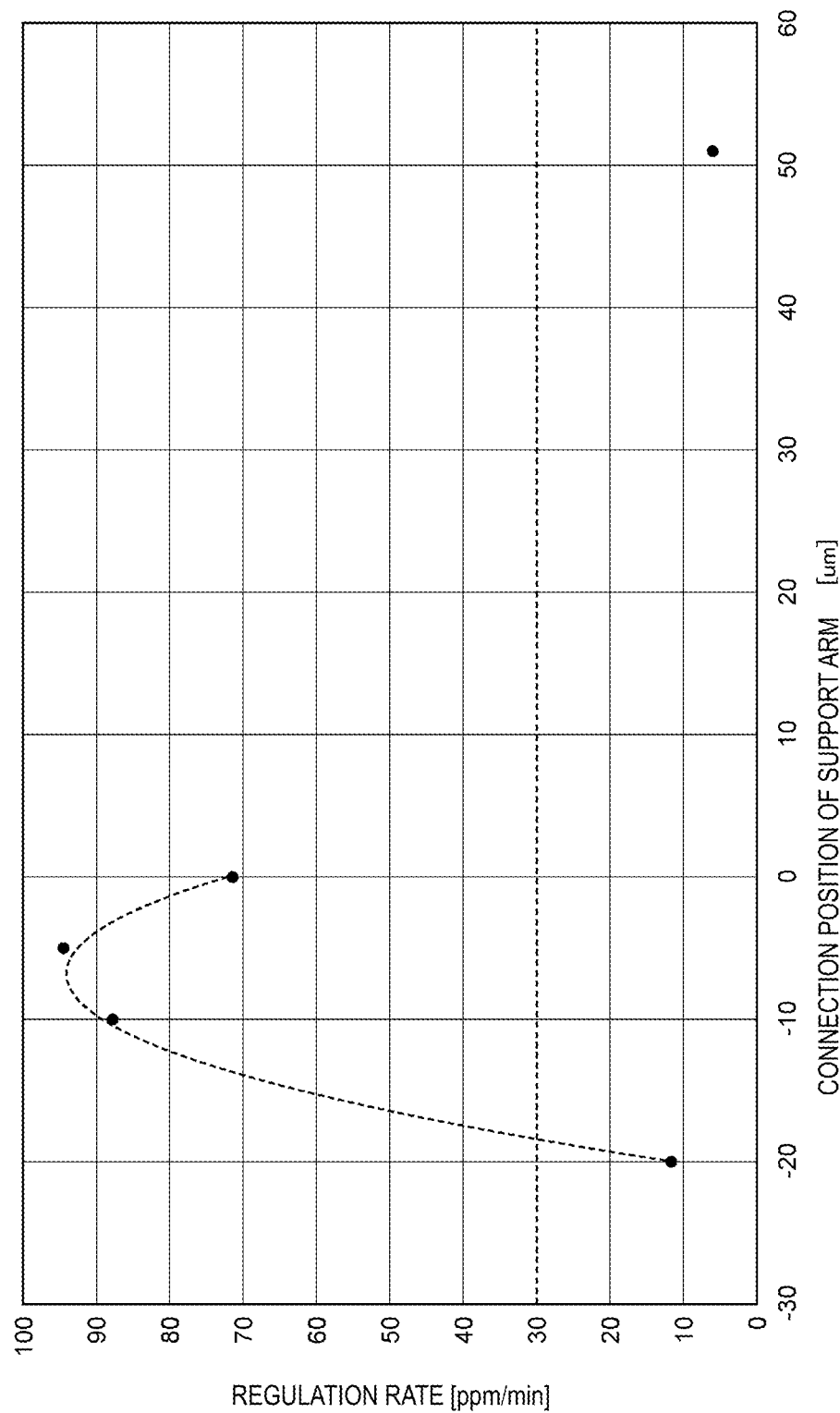
FIG. 13 is a graph illustrating relation between the connection positions of the support arm on the base portion and regulation rates for the resonant frequency with use of the overexcitation.

Subsequently, the regulation rate for the resonant frequency with use of the overexcitation will be described with reference to FIGS. 12 and 13. FIG. 12 is a graph illustrating relation between regulation time for a resonant frequency with use of overexcitation and changing rates in the resonant frequency, with different support arm lengths LS of the support arm 151 and different connection positions of the support arm 151. FIG. 13 is a graph illustrating relation between the connection positions of the support arm 151 on the base portion 130 and regulation rates for the resonant frequency with use of the overexcitation. In FIG. 12, a horizontal axis represents regulation time for the resonant frequency (f) with use of the overexcitation and a vertical axis represents the frequency changing rate (df/f) in the resonant frequency. Further, lines in FIG. 12 are lines under conditions of the support arm length LS of the support arm 151 of 125 μm with the connection position of the support arm 151 of 0 μm, the support arm length LS of the support arm 151 of 125 μm with the connection position of the support arm 151 of −5 μm, the support arm length LS of the support arm 151 of 125 μm with the connection position of the support arm 151 of −10 μm, the support arm length LS of the support arm 151 of 75 μm with the connection position of the support arm 151 of −20 μm, and the support arm length LS of the support arm 151 of 225 μm with the connection position of the support arm 151 of 51 μm. In FIG. 13, a horizontal axis represents the connection positions of the support arm 151 relative to the position of zero on the rear end portion 131B of the base portion 130 where the center line CL1 passes with the one side (right side) of the center line CL1 defined as positive and with the other side (left side) of the center line CL1 defined as negative. Meanwhile, a vertical axis represents the frequency changing rate (df/f) in the resonant frequency (f) per unit regulation time (1 min).

As illustrated in FIG. 12, it is observed that the frequency changing rates in the resonant frequency with use of the overexcitation are made relatively low under the conditions of the support arm length LS of the support arm 151 of 75 μm with the connection position of the support arm 151 of −20 μm and the support arm length LS of the support arm 151 of 225 μm with the connection position of the support arm 151 of 51 μm. It is conceived that this is because the regulation rate for the resonant frequency was decreased as a result of occurrence of a variation in the amounts of displacement of the vibrations of the plurality of vibrating arms 121A to 121D.

By contrast, it is observed that the frequency changing rates in the resonant frequency with use of the overexcitation are made relatively high under the conditions of the support arm length LS of the support arm 151 of 125 μm with the connection position of the support arm 151 of 0 μm, the support arm length LS of the support arm 151 of 125 μm with the connection position of the support arm 151 of −5 μm, and the support arm length LS of the support arm 151 of 125 μm with the connection position of the support arm 151 of −10 μm. It is conceived that this is because the decrease in the regulation rate for the resonant frequency was inhibited as a result of vibrations of the vibrating arms 121A to 121D with substantially maximum amounts of displacement and substantial uniformity.

An effective range for the regulation of the resonant frequency with use of the overexcitation is set to be the frequency regulation rates higher than or equal to 30 ppm/min, as an example. In this case, the effective range for the resonant frequency with use of the overexcitation is satisfied on condition that the support arm length LS of the support arm 151 is 125 μm in an example illustrated in FIG. 12.

On condition that the support arm length LS of the support arm 151 is 125 μm, there is radiation relation, such as a dotted line illustrated in FIG. 13, between the connection position of the support arm 151 and the regulation rate. The dotted line illustrated in FIG. 13 is a quadratic curve (e.g., a quadratic function) approximated based on plotted values of the regulation rate achieved with change in the connection position of the support arm 151. From an intersection point of the quadratic curve (e.g., a quadratic function) and the regulation rate of 30 ppm/min, the connection positions of the support arm 151 greater than or equal to −18.4 μm and smaller than or equal to 4.8 μm can be derived as a range resulting in the frequency regulation rates higher than or equal to 30 ppm/min.

In other words, the range resulting in the frequency regulation rates higher than or equal to 30 ppm/min is of the connection positions of the support arm 151 greater than or equal to −0.105 WB and smaller than or equal to 0.0027 WB with respect to the base portion width WB of the base portion 130 that is 176 μm in the one example.

In the resonator 10 of the embodiment, accordingly, the other end of the support arm 151 is connected to a position in a range from −0.1 WB to 0.1 WB with respect to the base portion width WB of the base portion 130 relative to the position, as a reference, on the rear end portion 131B of the base portion 130 where the center line CL1 passes in the plan view.

Figure 14:
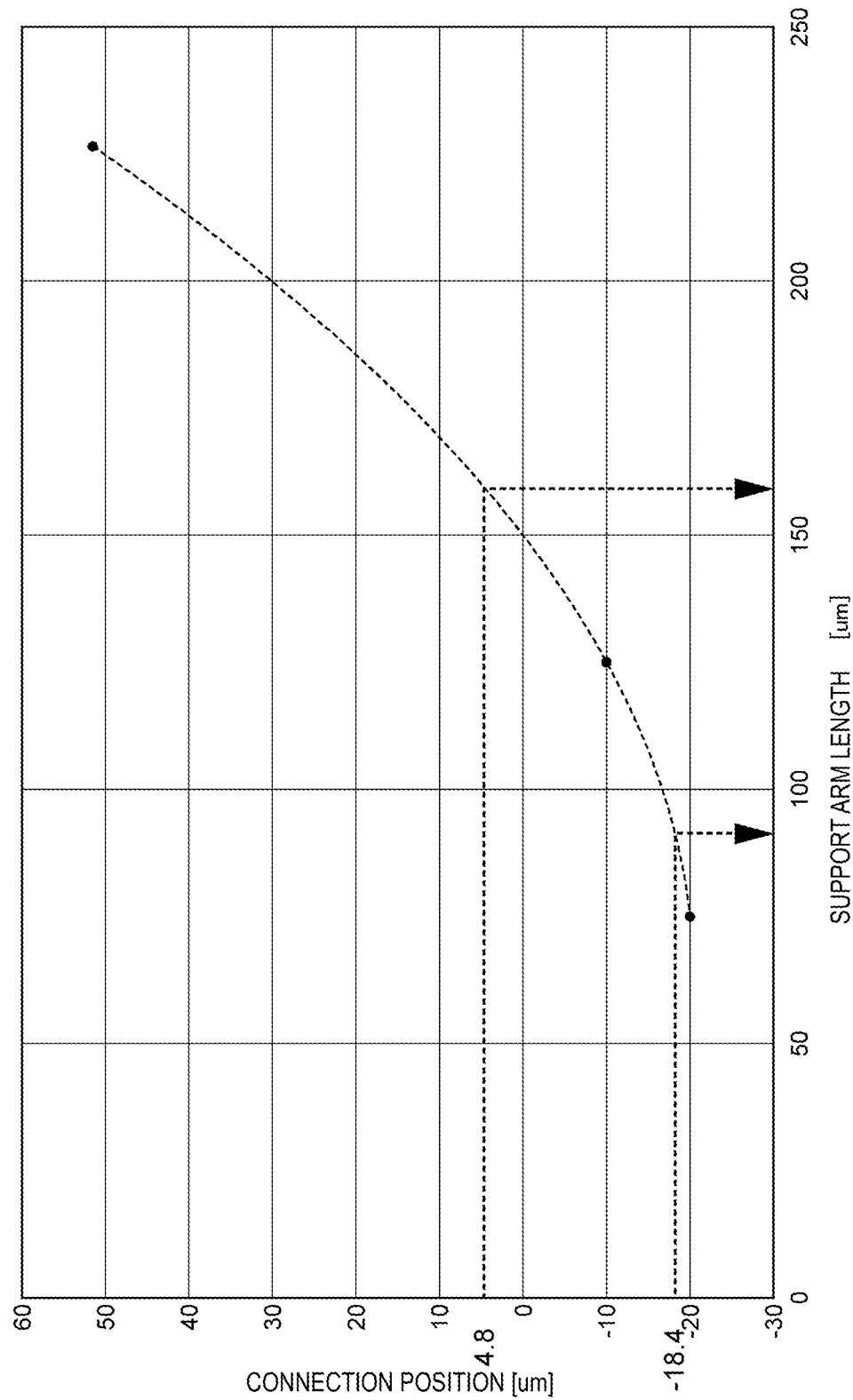
FIG. 14 is a graph illustrating relation between support arm lengths of the support arm and connection positions of the support arm on the base portion.

Herein, relation between the effective range for the regulation of the resonant frequency with use of the overexcitation and the improvement in DLD will be described with reference to FIG. 14. FIG. 14 is a graph illustrating relation between support arm lengths LS of the support arm 151 and connection positions of the support arm 151 on the base portion 130. In FIG. 14, a horizontal axis represents the support arm lengths LS of the support arm 151 and a vertical axis represents the connection positions of the support arm 151 relative to the position of zero on the rear end portion 131B of the base portion 130 where the center line CL1 passes with the one side (e.g., the right side) of the center line CL1 defined as positive and with the other side (e.g., the left side) of the center line CL1 defined as negative.

A dotted line illustrated in FIG. 14 is a line denoting combinations of the support arm lengths LS of the support arm 151 and the connection positions of the support arm 151 that make it possible to improve DLD of the resonator 10, as with the dotted line of FIG. 8. With application to FIG. 14 of the range of the connection positions of the support arm 151 greater than or equal to −18.4 µm and smaller than or equal to 4.8 µm, derived from the graph of FIG. 13 described above, a range of the support arm lengths LS of the support arm 151 greater than or equal to 88.8 µm and smaller than or equal to 158.7 µm can be derived.

In other words, the range which results in the frequency regulation rates higher than or equal to 30 ppm/min and which makes it possible to improve DLD of the resonator 10 is of the support arm lengths LS of the support arm 151 greater than or equal to 0.217 LA and smaller than or equal to 0.387 LA with respect to the vibrating arm length LA of the vibrating arms 121 that is 410 µm in one example.

In the resonator 10 of the embodiment, accordingly, the support arm length LS of the support arm 151 is 0.2 or more times and 0.4 or less times the vibrating arm length LA of the vibrating arms 121.

Thus, the other end of the support arm 151 is connected to a position in the range from −0.1 WB to 0.1 WB, with respect to the base portion width WB that is the length of the base portion 130 in a direction orthogonal to the center line CL1, relative to the position, as the reference, on the rear end portion 131B of the base portion 130 where the center line CL1 passes in the plan view. Meanwhile, the support arm length LS that is the length of the support arm 151 in a direction parallel to the longitudinal direction of the vibrating portion 110 is 0.2 or more times and 0.4 or less times the vibrating arm length LA that is the length of the vibrating arms 121 in the longitudinal direction. Thus, flexure of the base portion 130 can be increased, compared with conventional resonators being symmetrical or substantially symmetrical with respect to a center line of a vibrating portion along a longitudinal direction. Further, the vibrating arms 121A to 121D can be vibrated with the substantially maximum amounts of displacement and a bias in the frequency change for the plurality of vibrating arms 121A to 121D can be reduced when the resonant frequency is regulated by the overexcitation. As a result, satisfaction of the regulation rate with the effective range and lowering of the frequency changing rate in the resonant frequency per unit power that is an index of DLD can be both attained in the step for the regulation of the resonant frequency by the overexcitation. Therefore, DLD can be improved and the decrease in the regulation rate for the resonant frequency can be inhibited.

Further, the support arm 151 includes the support side arm 153 extending in a direction parallel to the longitudinal direction of the vibrating portion 110. Thus, the support arm 151 that satisfies the support arm length LS of 0.2 or more times and 0.4 or less times the vibrating arm length LA of the vibrating arms 121 can be easily implemented.

Additionally, the support arm 151 further includes the support rear arm 152 having one end connected to the support side arm 153 and the other end connected to the rear end portion 131B of the base portion 130. Thus, the support arm 151 having the other end connected to the position in the range from −0.1 WB to 0.1 WB, with respect to the base portion width WB that is the length of the base portion 130 in the direction orthogonal to the center line CL1, relative to the position, as the reference, on the rear end portion 131B of the base portion 130 where the center line CL1 passes can be easily implemented.

Herein, the inventors of the present invention have found that the frequency changing rate in the resonant frequency per unit power can be lowered on condition that a ratio of the base portion length LB of the base portion 130 to the base portion width WB of the base portion 130 is smaller than or equal to a specified multiple. More particularly, it has been found that the base portion length LB of the base portion 130 is preferably 0.3 or less times the base portion width WB of the base portion 130. Thus, the frequency changing rate in the resonant frequency per unit power can be effectively lowered.

Specifically, in the miniaturized resonator 10, the base portion length LB of the base portion 130 is smaller than or equal to 90 µm and the base portion width WB of the base portion 130 is smaller than or equal to 300 µm in an exemplary aspect. Thus, the frequency changing rate in the resonant frequency per unit power can be effectively lowered even in the miniaturized resonator 10 whose sizes are restricted.

Though the example in which the vibrating portion 110 of the resonator 10 includes the four vibrating arms 121A to 121D is used in the embodiment, there is no limitation thereto. The vibrating portion 110 may include three or five or more vibrating arms, for instance. In this case, at least two vibrating arms bend out of plane with different phases.

Though the example in which the one end of the support arm 151 of the resonator 10 is connected to the frame body 141D of the holding portion 140 is used in the embodiment, there is no limitation thereto. The one end of the support arm 151 may be connected to the frame body 141C of the holding portion 140, for instance.

In general, the exemplary embodiment of the present invention has been described above. In the resonator according to the one embodiment, the other end of the support arm is connected to the position in the range from −0.1 WB to 0.1 WB, with respect to the base portion width WB that is the length of the base portion in the direction orthogonal to the center line, relative to the position, as the reference, on the rear end portion of the base portion where the center line passes in the plan view. Further, the support arm length that is the length of the support arm in the direction parallel to the longitudinal direction of the vibrating portion is 0.2 or more times and 0.4 or less times the vibrating arm length that is the length of the vibrating arms in the longitudinal direction. Thus, the flexure of the base portion can be increased, compared with the conventional resonators being symmetrical or substantially symmetrical with respect to the center line of the vibrating portion in the longitudinal direction. Further, the vibrating arms can be vibrated with the substantially maximum amounts of displacement and the bias in the frequency changes for the plurality of vibrating arms can be reduced when the resonant frequency is regulated by the overexcitation. As a result, the satisfaction of the regulation rate with the effective range and the lowering of the frequency changing rate in the resonant frequency per unit power that is the index of DLD can be both attained in the step for the regulation of the resonant frequency by the overexcitation. Therefore, DLD can be improved and the decrease in the regulation rate for the resonant frequency can be inhibited.

Further, in the resonator according to the one embodiment, the support arm includes the support side arm extending in the direction parallel to the longitudinal direction of the vibrating portion. Thus, the support arm that satisfies the support arm length of 0.2 or more times and 0.4 or less times the vibrating arm length of the vibrating arms can be easily implemented.

Further, in the resonator according to the one embodiment, the support arm further includes the support rear arm having the one end connected to the support side arm and the other end connected to the rear end portion of the base portion. Thus, the support arm having the other end connected to the position in the range from −0.1 WB to 0.1 WB, with respect to the base portion width WB that is the length of the base portion in the direction orthogonal to the center line, relative to the position, as the reference, on the rear end portion of the base portion where the center line passes can be easily implemented.

Further, in the resonator according to the one embodiment, the base portion length that is the length of the base portion in the direction from the one end toward the other end thereof is 0.3 or less times the base portion width of the base portion. In this aspect, the frequency changing rate in the resonant frequency per unit power is lowered on condition that the ratio of the base portion length to the base portion width is smaller than or equal to a specified multiple, more particularly, 0.3 or less. Thus, the frequency changing rate in the resonant frequency per unit power can be effectively lowered.

Further, in the resonator according to the one embodiment, the base portion length of the base portion is smaller than or equal to 90 μm and the base portion width of the base portion is smaller than or equal to 300 μm. Thus, the frequency changing rate in the resonant frequency per unit power can be effectively lowered even in the miniaturized resonator whose sizes are restricted.

Further, the resonance device according to the one embodiment includes the resonator described above. Thus, the resonance device by which DLD is improved and by which the decrease in the regulation rate for the resonant frequency is inhibited can be easily implemented.

Further, the resonance device described above further includes the lower lid and the upper lid. Thus, the vibration space for the vibrating portion that bends out of plane can be easily formed.

Incidentally, the embodiments described above are intended for facilitating understanding of the present invention and are not intended for limitedly interpreting the invention. Modifications/improvements of the invention may be made without departing from the purport thereof and equivalents of the invention are also included in the invention. That is, the embodiments and/or modifications changed appropriately in design by those skilled in the art are encompassed by the scope of the invention, as long as features of the invention are provided therein. For instance, elements provided in the embodiments and/or modifications and placement, material, condition, shape, size, and the like thereof are not limited to those exemplified and can be appropriately changed. Additionally, the embodiments and modifications are exemplary, it goes without saying that partial substitution or combination of configurations disclosed in different embodiments and/or modifications can be made, and these are also encompassed by the scope of the invention as long as features of the invention are included therein.

REFERENCE SIGNS LIST 1 resonance device
10 resonator
20 lower lid
21 recessed portion
22 bottom plate
23 side wall
30 upper lid
31 recessed portion
32 bottom plate
33 side wall
40 joint portion
50 protruding portion
110 vibrating portion
120 excitation portion
121, 121A, 121B, 121C, 121D vibrating arm
122A, 122B, 122C, 122D mass addition portion
123A, 123B, 123C, 123D arm portion
125A, 125B, 125C, 125D mass addition film
130 base portion
131A front end portion
131B rear end portion
131C left end portion
131D right end portion
140 holding portion
141A, 141B, 141C, 141D frame body
151 support arm
152 support rear arm
153 support side arm
CL1 center line
LA vibrating arm length
LB base portion length
LS support arm length
r1, r2 center axis
WA vibrating arm width
WB base portion width
WG width
WS support arm width

The invention claimed is:

1. A resonator comprising:
a vibrating portion including:
    a base having first and second ends that oppose each other, and
    at least three vibrating arms that each have a fixed end connected to the first end of the base and include at least two vibrating arms configured to bend out of plane with different phases of one another;
a frame configured to hold the vibrating portion; and
a support arm having a first end connected to the frame and a second end connected to the second end of the base,
wherein the second end of the support arm is connected to a position in a range from −0.1 WB to 0.1 WB relative to a position on the second end of the base, where a center line of the vibrating portion in a longitudinal direction thereof passes in a plan view with respect to a base width WB that is a length of the base in a direction orthogonal to the center line, and
wherein a length of the support arm in a direction parallel to the longitudinal direction of the vibrating portion is 0.2 or more times and 0.4 or less times a length of each the vibrating arms in the longitudinal direction.

2. The resonator according to claim 1, wherein the support arm includes a support side arm extending in a direction parallel to the longitudinal direction of the vibrating portion.

3. The resonator according to claim 2, wherein the support arm further includes a support rear arm having a first end connected to the support side arm and a second end connected to the second end of the base.

4. The resonator according to claim 1, wherein the base has a base length in a direction from the first end toward the second end thereof that is 0.3 or less times the base width.

5. The resonator according to claim 4, wherein the base length is smaller than or equal to 90 µm, and the base width is smaller than or equal to 300 µm.

6. The resonator according to claim 1, further comprising a plurality of mass addition portions on respective ends of the at least three vibrating arms that are opposite the fixed ends.

7. The resonator according to claim 6, wherein the plurality of mass addition portions each have a width in the direction orthogonal to the longitudinal direction of the vibrating portion that is 1.5 or more times than respective widths of the at least three vibrating arms.

8. The resonator according to claim 1, wherein the center line of the vibrating portion in the longitudinal direction thereof passes through a center of the at least three vibrating arms with respect to the longitudinal direction and is located between an inner pair of the at least three vibrating arms.

9. The resonator according to claim 8, wherein the support arm extends in the longitudinal direction to connect to the second end of the base at a position so as not to be in line symmetry with respect to the center line.

10. The resonator according to claim 8, wherein the support arm extends in the longitudinal direction to connect to the second end of the base so as to be asymmetric in the plan view.

11. The resonator according to claim 8, wherein the support arm extends in the longitudinal direction to connect to the second end of the base at a position that deviates by at least 10 µm to a negative side in the direction orthogonal to the center line.

12. A resonance device comprising:
the resonator according to claim 1.

13. The resonance device according to claim 12, further comprising:
a lid body.

14. The resonance device according to claim 13, further comprising a protruding portion that protrudes from a recessed portion of a lower lid of the lid body into a vibration space.

15. The resonance device according to claim 14, wherein the protruding portion is disposed between a pair of vibrating arms of the at least three vibrating arms and is formed in a shape of a prism.

16. A resonator comprising:
a vibrating portion including:
a base having first and second ends that oppose each other, and
a plurality of vibrating arms each having a fixed end connected to the first end of the base;
a frame that holds the vibrating portion; and
a support arm having a first end connected to the frame and a second end connected to the second end of the base,
wherein a center line of the vibrating portion extends in a longitudinal direction and passes through a center of the plurality of vibrating arms with respect to the longitudinal direction, and
wherein the support arm includes an arm segment that extends in the longitudinal direction to connect to the second end of the base asymmetrically with respect to the center line in a plan view of the vibrating portion.

17. The resonator according to claim 16, wherein the support arm is connected to a position at the second end of the base in a range from −0.1 WB to 0.1 WB relative to a position on the second end of the base with respect to a base width WB that is a length of the base in a direction orthogonal to the center line.

18. The resonator according to claim 17, wherein a length of the support arm in a direction parallel to the longitudinal direction of the vibrating portion is 0.2 or more times and 0.4 or less times a length of each the plurality of vibrating arms in the longitudinal direction.

19. The resonator according to claim 18, wherein the support arm extends in the longitudinal direction to connect to the second end of the base at a position that deviates by at least 10 µm to a negative side in the direction orthogonal to the center line.

20. The resonator according to claim 16, wherein the plurality of vibrating arms comprise at least three vibrating arms with at least two vibrating arms configured to bend out of plane with different phases of one another.

* * * * *